(12) United States Patent
Lin et al.

(10) Patent No.: US 10,204,889 B2
(45) Date of Patent: Feb. 12, 2019

(54) PACKAGE STRUCTURE AND METHOD OF FORMING THEREOF

(71) Applicant: TAIWAN SEMICONDUCTOR MANUFACTURING CO., LTD., Hsinchu (TW)

(72) Inventors: Jing-Cheng Lin, Hsinchu (TW); Po-Hao Tsai, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/409,385

(22) Filed: Jan. 18, 2017

(65) Prior Publication Data
US 2018/0151546 A1    May 31, 2018

Related U.S. Application Data

(60) Provisional application No. 62/427,088, filed on Nov. 28, 2016.

(51) Int. Cl.
*H01L 21/02* (2006.01)
*H01L 25/11* (2006.01)
(Continued)

(52) U.S. Cl.
CPC ...... *H01L 25/117* (2013.01); *H01L 21/02354* (2013.01); *H01L 21/6835* (2013.01); *H01L 21/76883* (2013.01); *H01L 23/49822* (2013.01); *H01L 23/49838* (2013.01); *H01L 24/03* (2013.01); *H01L 24/09* (2013.01); *H01L 24/11* (2013.01); *H01L 24/14* (2013.01); *H01L 25/0657* (2013.01); *H01L 25/105* (2013.01); *H01L 25/50* (2013.01); *H01L 21/565* (2013.01); *H01L 21/568* (2013.01); *H01L 22/14* (2013.01); *H01L 23/3128* (2013.01); *H01L 23/562* (2013.01); *H01L 24/13* (2013.01); *H01L 24/16* (2013.01); *H01L 24/29* (2013.01); *H01L 24/32* (2013.01); *H01L 24/48* (2013.01); *H01L 24/49* (2013.01); *H01L 24/81* (2013.01); *H01L 24/83* (2013.01); *H01L 2221/68359* (2013.01); *H01L 2224/02331* (2013.01);
(Continued)

(58) Field of Classification Search
CPC .................................................... H01L 25/117
See application file for complete search history.

(56) References Cited

U.S. PATENT DOCUMENTS 5,224,265 A * 7/1993 Dux ............... H01L 21/4857
257/E23.172
5,454,927 A * 10/1995 Credle ............. H05K 3/4038
205/123

(Continued)

*Primary Examiner* — Eugene Lee
(74) *Attorney, Agent, or Firm* — Maschoff Brennan

(57) ABSTRACT

A package structure includes a semiconductor device, a first dielectric layer, a redistribution line and a conductive bump. The first dielectric layer is over the semiconductor device and has first and second openings on opposite surfaces of the first dielectric layer, wherein the first and second openings taper in substantially opposite direction. The redistribution line is partially in the first opening of the first dielectric layer and electrically connected to the semiconductor device. The conductive bump is partially embeddedly retained in the second opening and electrically connected to the redistribution line.

20 Claims, 25 Drawing Sheets

(51) Int. Cl.
    *H01L 21/768*    (2006.01)
    *H01L 23/498*    (2006.01)
    *H01L 23/00*     (2006.01)
    *H01L 25/065*    (2006.01)
    *H01L 25/00*     (2006.01)
    *H01L 25/10*     (2006.01)
    *H01L 21/683*    (2006.01)
    *H01L 21/56*     (2006.01)
    *H01L 23/31*     (2006.01)
    *H01L 21/66*     (2006.01)

(52) U.S. Cl.
    CPC ........... *H01L 2224/0401* (2013.01); *H01L 2224/04042* (2013.01); *H01L 2224/05573* (2013.01); *H01L 2224/05647* (2013.01); *H01L 2224/08111* (2013.01); *H01L 2224/131* (2013.01); *H01L 2224/1308* (2013.01); *H01L 2224/13021* (2013.01); *H01L 2224/13144* (2013.01); *H01L 2224/13147* (2013.01); *H01L 2224/13155* (2013.01); *H01L 2224/13164* (2013.01); *H01L 2224/16227* (2013.01); *H01L 2224/2919* (2013.01); *H01L 2224/32013* (2013.01); *H01L 2224/32225* (2013.01); *H01L 2224/48091* (2013.01); *H01L 2224/48227* (2013.01); *H01L 2224/49113* (2013.01); *H01L 2224/73204* (2013.01); *H01L 2224/81005* (2013.01); *H01L 2224/83005* (2013.01); *H01L 2224/83102* (2013.01); *H01L 2224/97* (2013.01); *H01L 2225/0651* (2013.01); *H01L 2225/0652* (2013.01); *H01L 2225/06548* (2013.01); *H01L 2225/06568* (2013.01); *H01L 2225/06586* (2013.01); *H01L 2225/1035* (2013.01); *H01L 2225/1058* (2013.01); *H01L 2924/18161* (2013.01)

(56) References Cited

U.S. PATENT DOCUMENTS

| | | | | |
|---|---|---|---|---|
| 6,114,240 | A * | 9/2000 | Akram | H01L 21/486 257/E21.511 |
| 6,166,438 | A * | 12/2000 | Davidson | H01L 21/6835 257/700 |
| 6,281,448 | B1 * | 8/2001 | Tsukamoto | H01L 23/3107 174/260 |
| 6,329,610 | B1 * | 12/2001 | Takubo | H01L 23/49827 174/255 |
| 6,344,371 | B2 * | 2/2002 | Fischer | H01L 23/49827 257/700 |
| 6,486,394 | B1 * | 11/2002 | Schmidt | H05K 1/0221 156/52 |
| 6,490,170 | B2 * | 12/2002 | Asai | H01L 23/49816 361/794 |
| 6,548,767 | B1 * | 4/2003 | Lee | H05K 1/115 174/255 |
| 6,972,382 | B2 * | 12/2005 | Zollo | H05K 3/4623 174/262 |
| 6,980,017 | B1 * | 12/2005 | Farnworth | G01R 1/0466 324/755.07 |
| 7,087,991 | B2 * | 8/2006 | Chen | H01L 23/5389 257/698 |
| 7,205,483 | B2 * | 4/2007 | Yamashita | H05K 3/20 174/254 |
| 7,284,323 | B2 * | 10/2007 | Cheng | H05K 3/0032 29/847 |
| 7,332,816 | B2 * | 2/2008 | Hirose | H05K 1/0256 174/261 |
| 7,462,939 | B2 * | 12/2008 | Sundstrom | H01L 23/49827 174/260 |
| 7,569,935 | B1 * | 8/2009 | Fan | H01L 24/16 257/737 |
| 7,666,711 | B2 * | 2/2010 | Pagaila | H01L 21/561 257/620 |
| 7,786,390 | B2 * | 8/2010 | Ikeda | H05K 1/119 174/255 |
| 7,834,273 | B2 * | 11/2010 | Takahashi | H05K 1/115 257/774 |
| 7,969,016 | B2 * | 6/2011 | Chen | H01L 21/76898 257/738 |
| 8,237,060 | B2 * | 8/2012 | Tanaka | H01L 23/5389 174/260 |
| 9,078,343 | B2 * | 7/2015 | Yamauchi | H05K 3/0032 |
| 9,215,805 | B2 * | 12/2015 | Zanma | H05K 1/115 |
| 9,570,400 | B2 * | 2/2017 | Baek | H01L 23/14 |
| 2002/0180027 | A1 * | 12/2002 | Yamaguchi | H01L 21/486 257/700 |
| 2004/0061238 | A1 * | 4/2004 | Sekine | H01L 21/76898 257/774 |
| 2005/0039948 | A1 * | 2/2005 | Asai | H05K 3/387 174/262 |
| 2005/0230711 | A1 * | 10/2005 | Chang | H05K 1/115 257/210 |
| 2008/0107863 | A1 * | 5/2008 | Ikeda | H01L 21/4857 428/137 |
| 2008/0296056 | A1 * | 12/2008 | Kinoshita | H01L 23/13 174/261 |
| 2010/0304530 | A1 * | 12/2010 | Yim | H01L 23/04 438/109 |
| 2010/0307807 | A1 * | 12/2010 | Noda | H05K 1/115 174/264 |
| 2012/0025365 | A1 * | 2/2012 | Haba | H01L 21/4853 257/692 |
| 2012/0068330 | A1 * | 3/2012 | Oganesian | H01L 21/76898 257/698 |
| 2012/0133048 | A1 * | 5/2012 | Lee | H01L 21/76898 257/774 |
| 2012/0139124 | A1 * | 6/2012 | Oganesian | H01L 23/481 257/774 |
| 2012/0246924 | A1 * | 10/2012 | Hibino | H01L 23/49827 29/829 |
| 2014/0083757 | A1 * | 3/2014 | Hu | H05K 3/4602 174/262 |
| 2016/0163566 | A1 * | 6/2016 | Chen | H01L 25/105 257/774 |
| 2017/0110440 | A1 * | 4/2017 | Jang | H01L 25/0657 |

* cited by examiner

PACKAGE STRUCTURE AND METHOD OF FORMING THEREOF

PRIORITY CLAIM AND CROSS-REFERENCE

This application claims priority to U.S. Provisional Application Ser. No. 62/427,088, filed Nov. 28, 2016, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
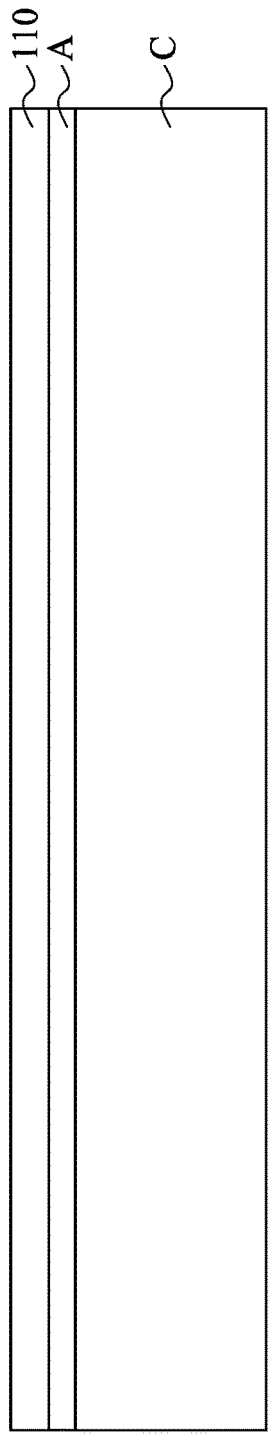
FIGS. 1-27 are cross-sectional views of intermediate stages in the manufacturing of a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-27 are cross-sectional views of intermediate stages in the manufacturing of a package structure in accordance with some embodiments of the present disclosure. Reference is made to FIG. 1. An adhesive layer A is formed on a carrier C. The carrier C may be a blank glass carrier, a blank ceramic carrier, a metal frame, or the like. The adhesive layer A may be made of an adhesive, such as ultra-violet (UV) glue, light-to-heat conversion (LTHC) glue, or the like, although other types of adhesives may be used. A first buffer layer 110 is formed over the adhesive layer A using a spin coating process, a film lamination process, or a deposition process, as examples. The first buffer layer 110 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. In some embodiments, the first buffer layer 110 may be a composite layer that combines the buffer layer 110 with adhesive layer A into one layer. The first buffer layer 110 may be a substantially planar layer having a substantially uniform thickness, in which the thickness may be greater than about 2 µm, and may be in a range from about 0.5 µm to about 40 µm. In some embodiments, top and bottom surfaces of the first buffer layer 110 are also substantially planar.

Figure 2:
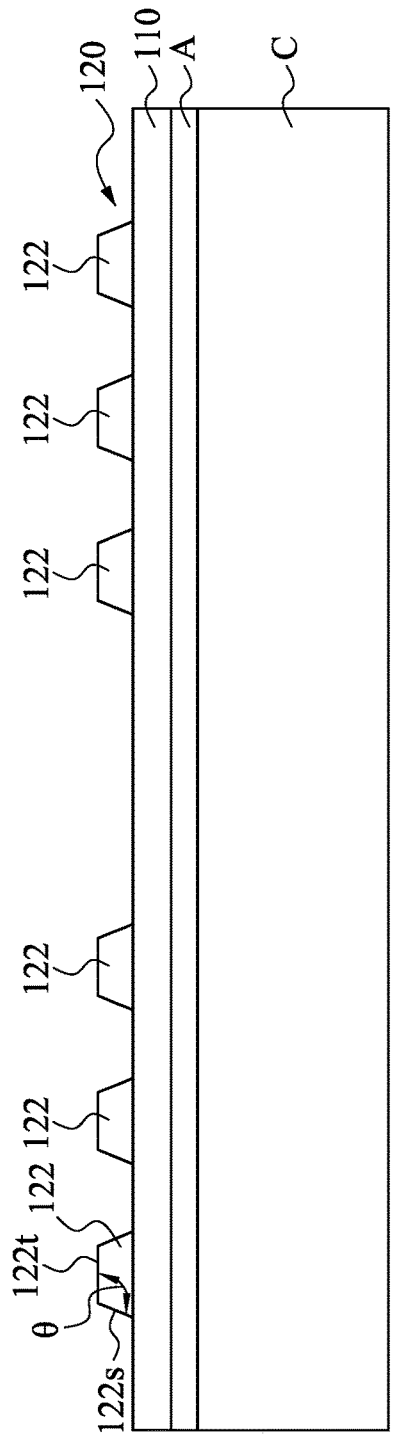

Reference is made to FIG. 2. A second buffer layer 120 is formed over the first buffer layer 110 using a spin coating process or a lamination process, as examples. Thereafter, the second buffer layer 120 is patterned to form a plurality of protrusions 122 on the first buffer layer 110. The protrusions 122 may be arranged in a grid pattern of rows and columns that corresponds a subsequently formed ball grid array (BGA). The second buffer layer 120 may be patterned using a lithography process. The patterning process may create a top surface 122t and sidewalls 122s of the protrusion 122. The sidewall 122s coincides with the top surface 122t, and they define an angle θ therebetween. The angle θ may be an obtuse angle that is greater than 90 degrees. In other words, the protrusions 122 taper in a direction substantially farther away from the carrier C. That is, the protrusions 122 expand in a direction substantially toward the carrier C. Such an angle θ may be controlled by the lithography or etching process performed to the exposed portions of the second buffer layer 120. The protrusion 122 may be beneficial to shape a contact pad formed thereon in the subsequent steps.

In some embodiments, the second buffer layer 120 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. In some embodiments, the first buffer layer 110 and the second buffer layer 120 may be made of substantially the same material, and they can be formed in the same process as a thick buffer layer, collectively. A lithography process may be performed to this thick buffer layer to form the protrusions 122 and recesses (not labeled) among the protrusions 122, and portions of the thick buffer layer may remain below these recesses.

Figure 3:
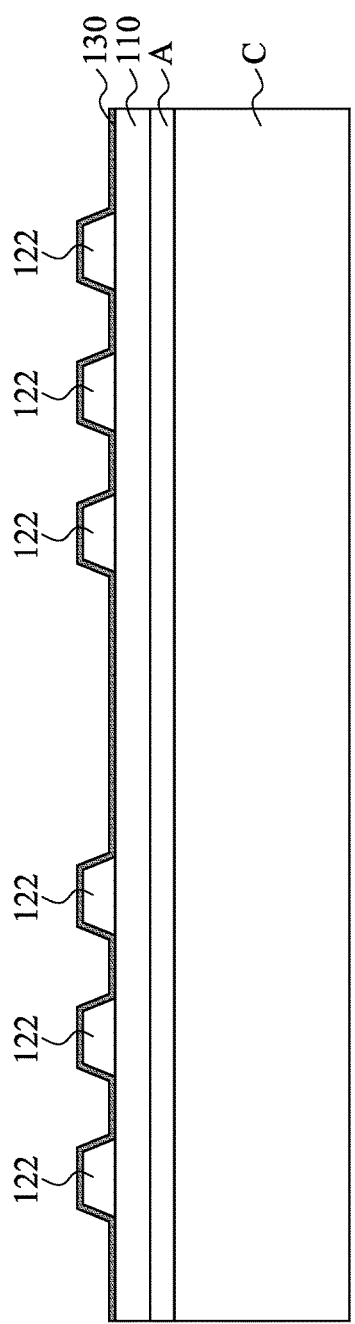

Reference is made to FIG. 3. A first seed layer 130 is formed over the carrier C, e.g., the first seed layer 130 is formed over the first buffer layer 110 and the protrusions 122 present on the carrier C. The first seed layer 130 includes about 0.3 µm of a material such as titanium (Ti), copper (Cu), or a combination thereof deposited using physical vapor deposition (PVD) or by lamination of a foil material in some embodiments, for example. Alternatively, the first seed layer 130 may include other materials and dimensions and may be formed using other methods.

Figure 4:
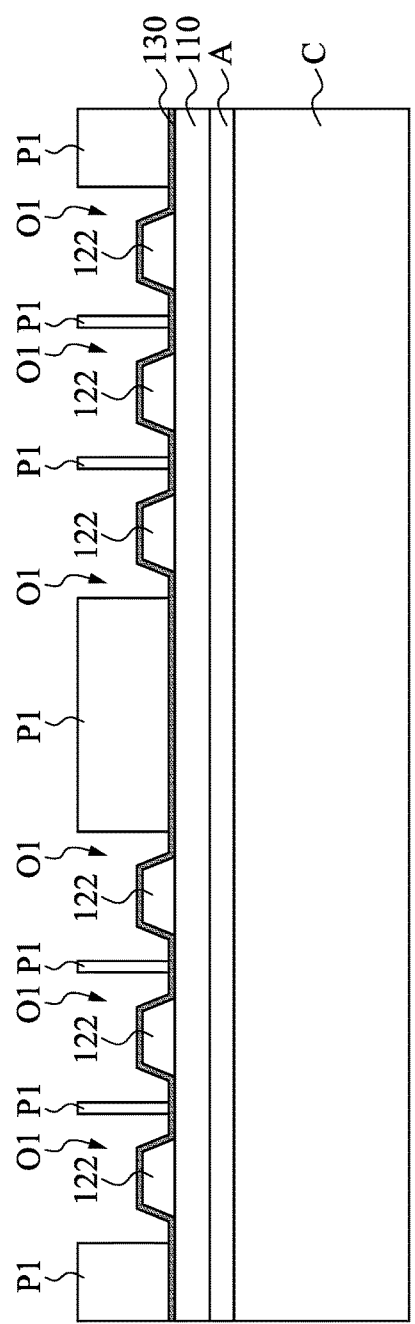

Reference is made to FIG. 4. A photoresist P1 is applied over the first seed layer 130 and is then patterned. As a result, openings O1 are formed in the photoresist P1, through which some portions of the first seed layer 130 are exposed.

Figure 5:
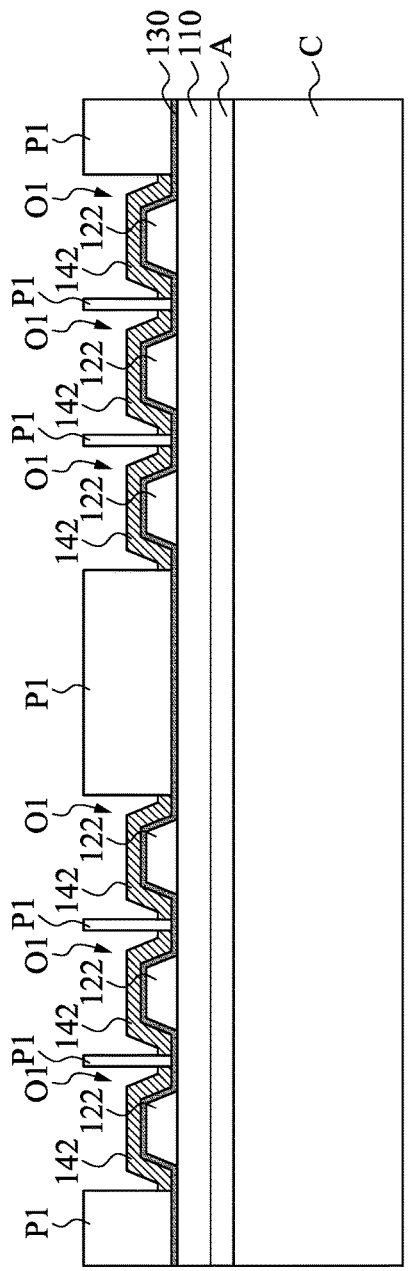
Figure 6:
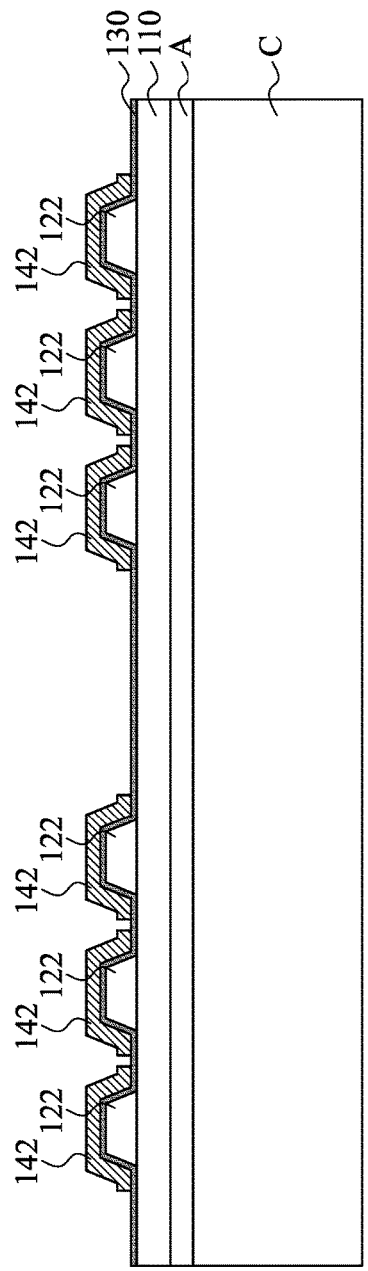

Reference is made to FIG. 5. First conductive features 142 are respectively formed in the openings O1 of the photoresist P1 through plating, which may be electro plating or electro-less plating. The first conductive features 142 are plated on the exposed portions of the first seed layer 130. The first conductive features 142 may include a metal or a metal alloy including aluminum, copper, tungsten, and/or alloys thereof. After the plating of the first conductive features 142, the photoresist P1 is removed, and the resulting structure is shown in FIG. 6. After the photoresist P1 is removed, some portions of the first seed layer 130 are exposed.

Figure 7:
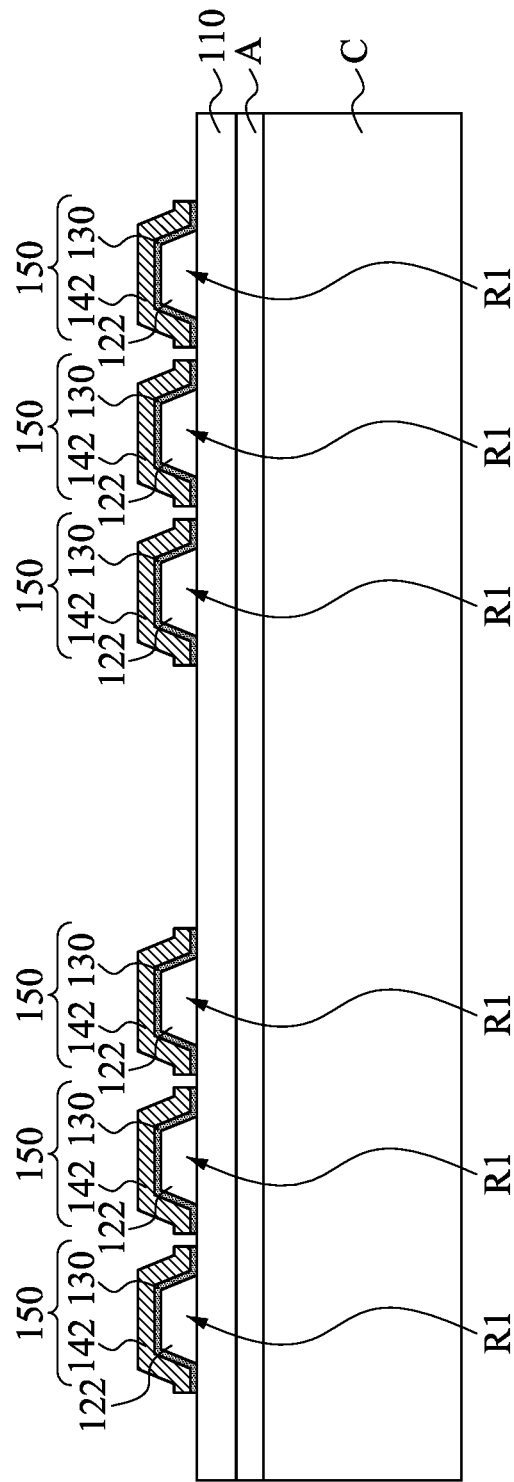

Reference is made to FIG. 7. An etch operation is performed to remove the exposed portions of the first seed layer 130, and the etch operation may include an anisotropic etching. Some portions of the first seed layer 130 that are covered by the first conductive features 142, on the other hand, remain not etched. Throughout the description, the first conductive features 142 and the remaining underlying portions of the first seed layer 130 are in combination referred to as contact pads 150. Since the contact pads 150 are formed conformally over the underlying protrusions 122, each of the contact pads 150 in turn defines a recess R1 that receives the corresponding underlying protrusion 122. In other words, the recesses R1 defined by the contact pads 150 can be shaped by the protrusions 122. That is, the recesses R1 and the protrusions 122 can have substantially the same shape. In the instant example, each of the recesses R1 tapers in the direction substantially farther away from the carrier C. Stated differently, the recesses R1 expand in the direction substantially toward the carrier C. Further, since the protrusions 122 are arranged in a grid pattern of rows and columns, the recesses R1 that respectively receive the protrusions 122 are arranged in a grid pattern of rows and columns as well, so that conductive bumps (e.g., solder balls) subsequently formed in the recesses R1 can form a ball grid array (BGA).

Although the first seed layer 130 is shown as a layer separate from the first conductive features 142, when the first seed layer 130 is made of a material similar to or substantially the same as the respective overlying first conductive features 142, the first seed layer 130 may be merged with the first conductive features 142 substantially free from distinguishable interface therebetween. In alternative embodiments, there exist distinguishable interfaces between the first seed layer 130 and the overlying first conductive features 142.

Figure 8:
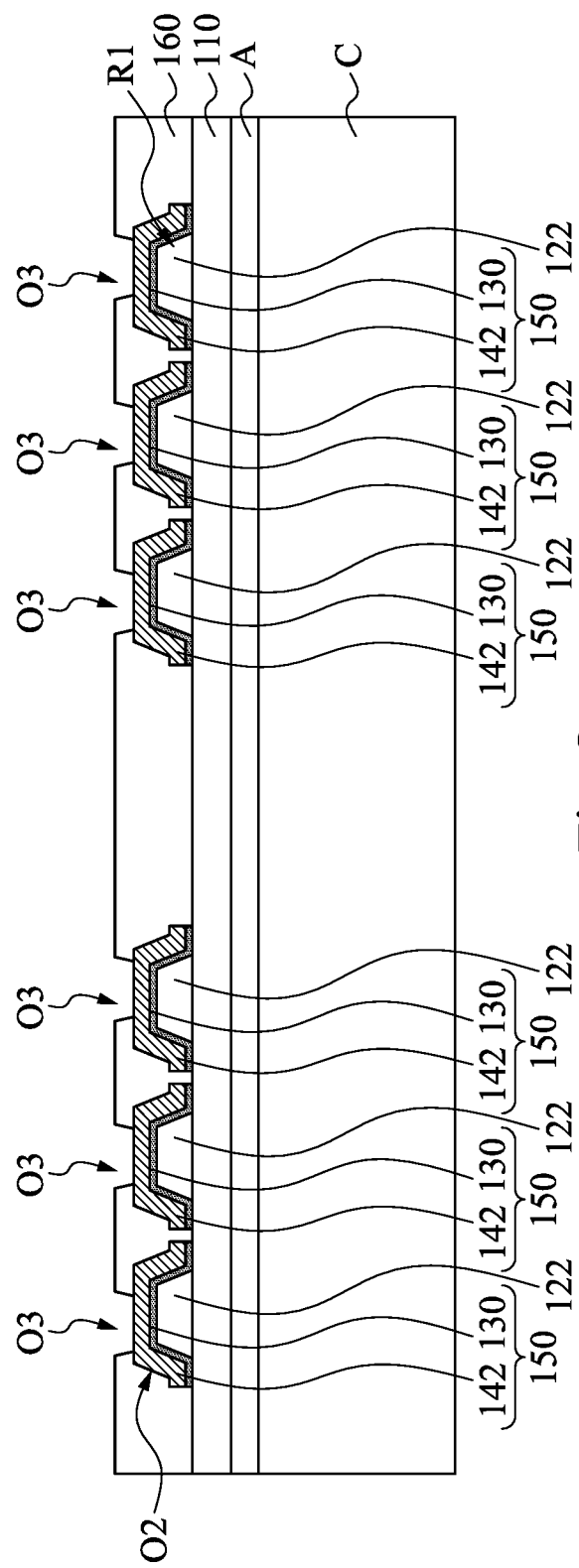

Reference is made to FIG. 8. A first dielectric layer 160 is formed over the contact pads 150, especially the first conductive features 142. The first dielectric layer 160 has openings O2 that respectively receive the contact pads 150 therein. More particularly, the contact pads 150 are respectively embeddedly retained in the openings O2, and hence the openings O2 have geometry substantially the same as that of the contact pads 150. Therefore, the openings O2 taper in the direction substantially farther away from the carrier C. The first dielectric layer 160 may include a polymer such as polyimide, benzocyclobutene (BCB), polybenzoxazole (PBO), or the like, which is deposited using a spin coating process or a lamination process, as examples. Alternatively, the first dielectric layer 160 may include non-organic dielectric materials such as silicon oxide, silicon nitride, silicon carbide, silicon oxynitride, or the like. The first dielectric layer 160 is patterned using a lithography process. For example, a photoresist (not shown) may be formed over the first dielectric layer 160, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the first dielectric layer 160 are removed during the etch process to form openings O3, through which some portions of the first conductive features 142 are exposed. In some embodiments, the openings O3 taper in the direction substantially toward the carrier C. In other words, the openings O2 and O3 taper in substantially opposite directions. Moreover, the openings O3 of the first dielectric layer 160 and the recesses R1 defined by the contact pads 150 taper in substantially opposite directions. The tapering profile of the openings O3 can be controlled by the etch process performed to the first dielectric layer 160. Afterwards, the photoresist is removed.

Figure 9:
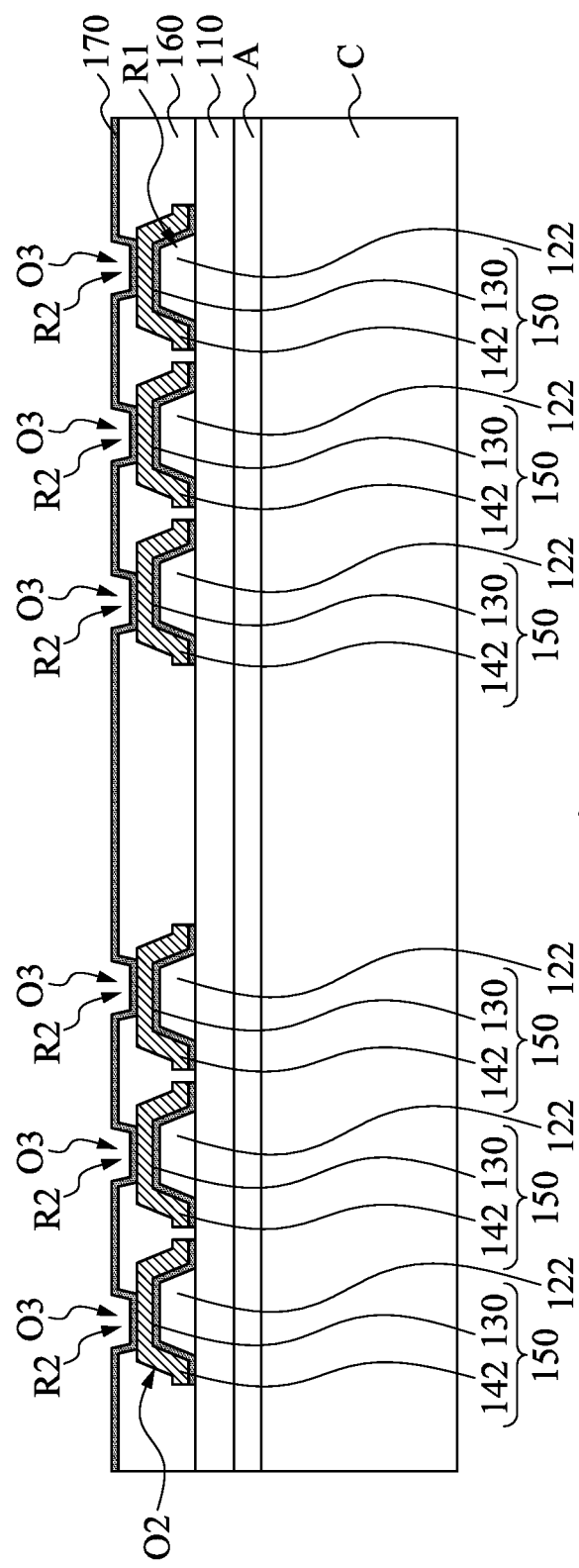

Reference is made to FIG. 9. A second seed layer 170 is formed over the carrier C, e.g., the second seed layer 170 is formed over the first dielectric layer 160 and in the openings O3 of the first dielectric layer 160. In some embodiments, the second seed layer 170 is conformally formed on the first dielectric layer 160 and in the openings O3, and therefore, the second seed layer 170 includes recesses R2 that taper in the direction substantially toward the carrier C. In other words, the tapering profile of the recesses R2 is similar to or substantially the same as that of the openings O3 of the first dielectric layer 160, and therefore, the recesses R2 of the second seed layer 170 and the recesses R1 defined by the contact pads 150 taper in substantially opposite directions. The second seed layer 170 includes about 0.3 µm of a material such as titanium (Ti), copper (Cu), or a combination thereof deposited using PVD or by lamination of a foil material in some embodiments, for example. Alternatively, the second seed layer 170 may include other materials and dimensions and may be formed using other methods.

Figure 10:
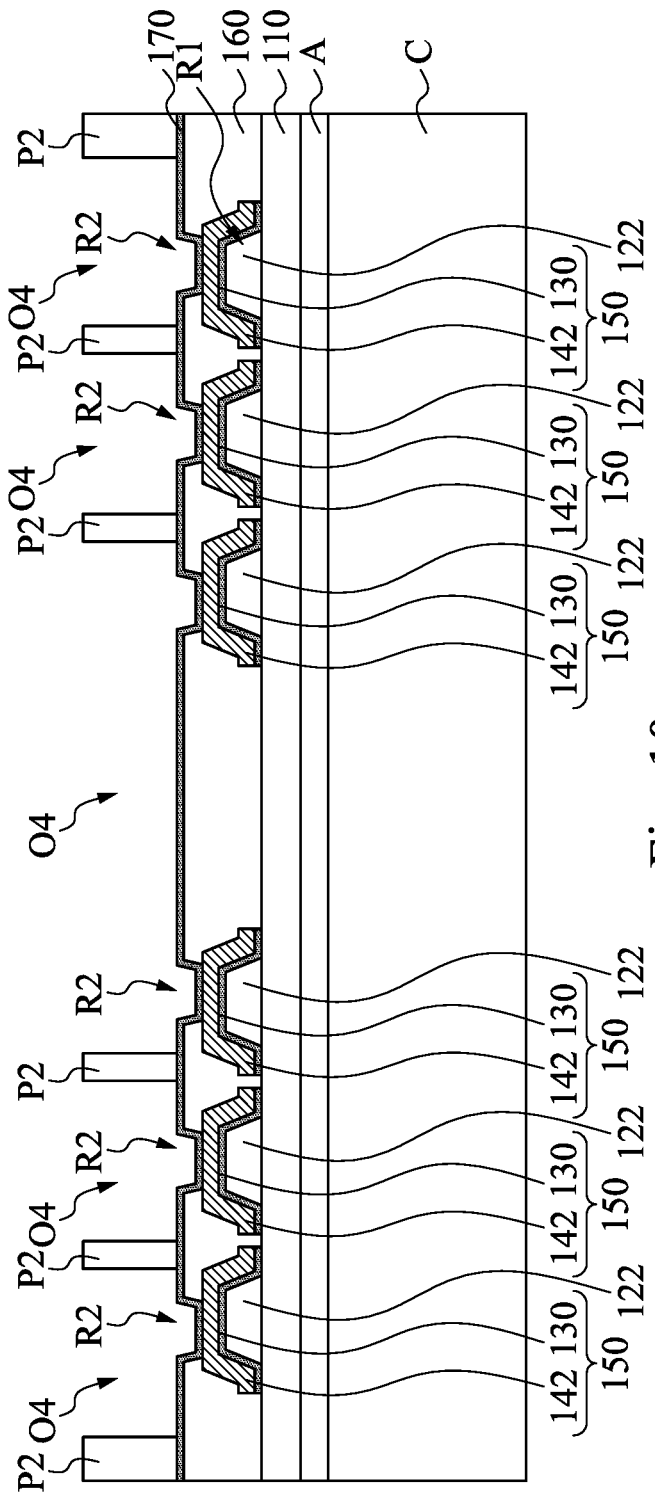

Reference is made to FIG. 10. A photoresist P2 is applied over the second seed layer 170 and is then patterned. As a result, openings O4 are formed in the photoresist P2, through which some portions of the second seed layer 170 having the recesses R2 therein are exposed. In other words, the recesses R2 are not covered by the photoresist P2. The photoresist P2 is patterned using lithography to further define the pattern for the conductive features formed in a subsequent step. The patterns of openings O4 in the photoresist P2 are slightly larger than the patterns of the recesses R2 in the second seed layer 170 in some embodiments, as illustrated in FIG. 10. Alternatively, the patterns of the openings O4 in the photoresist P2 can be substantially the same as, or smaller than, the patterns of the recesses R2 in the second seed layer 170 in some other embodiments (not shown).

Figure 11:
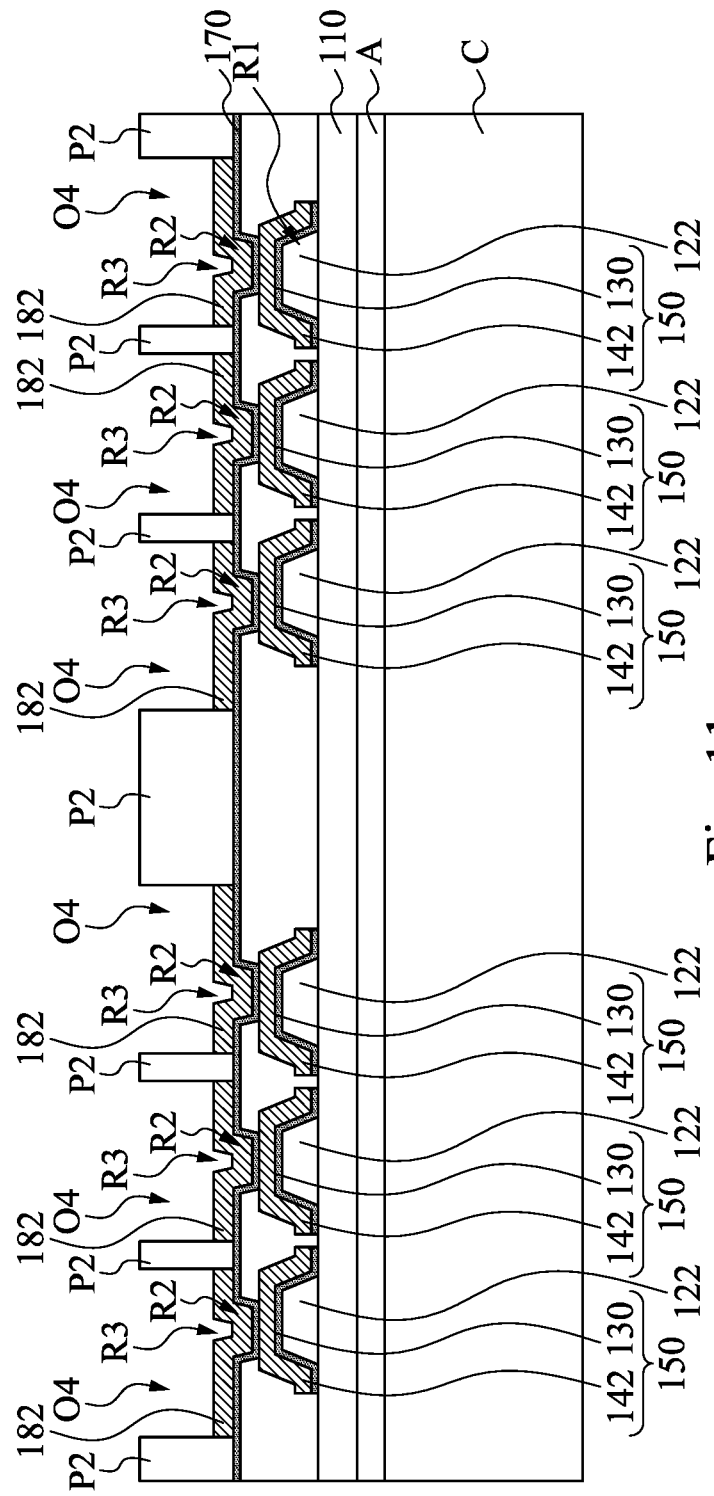
Figure 12:
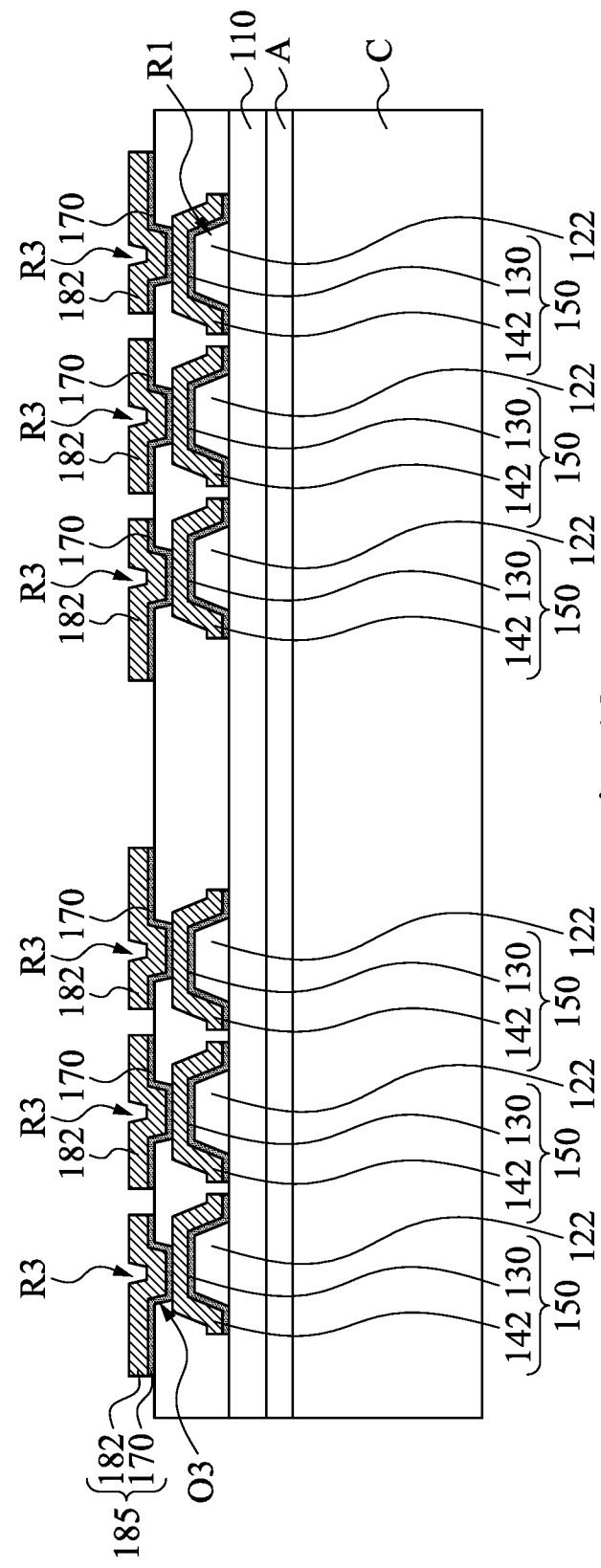

Reference is made to FIG. 11. Second conductive features 182 are respectively formed in the openings O4 of the photoresist P2 through, for example, plating, which may be electro plating or electro-less plating. The second conductive features 182 are plated on the exposed portions of the second seed layer 170. In some embodiments, the second conductive features 182 are conformally formed on the exposed portions of the second seed layer 170 that includes the recesses R2, and therefore, the second conductive features 182 define recesses R3 that taper in the direction substantially toward the carrier C. In other words, the tapering profile of the recesses R2 of the second seed layer 170 is similarly to or substantially the same as that of the recesses R3 defined by the second conductive features 182, and therefore, the recesses R3 defined by the second conductive features 182 and the recesses R1 defined by the contact pads 150 taper in substantially opposite directions. The second conductive features 182 may include a metal or a metal alloy including aluminum, copper, tungsten, and/or alloys thereof. After the plating of the second conductive features 182, the photoresist P2 is removed. After the photoresist P2 is removed, some portions of the second seed layer 170 are exposed, and an etch step can be performed to remove the exposed portions of the second seed layer 170, and the etch step may include an anisotropic etching. Some portions of the second seed layer 170 that are covered by the second conductive features 182, on the other hand, remain not etched, and the resulting structure is shown in FIG. 12. The second conductive features 182 and remaining portions of the second seed layer 170 can be collectively referred to as redistribution lines (RDLs) 185. The RDL 185 is partially in the opening O3. More particularly, the RDL 185 is conformally over the opening O3. Although the second seed layer 170 is shown as a layer separate from the second conductive features 182, when the second seed layer 170 is made of a material similar to or substantially the same as the respective overlying second conductive features 182, the second seed layer 170 may be merged with the second conductive features 182 substantially free from distinguishable interface therebetween. In alternative embodiments, there exist distinguishable interfaces between the second seed layer 170 and the overlying second conductive features 182.

Figure 13:
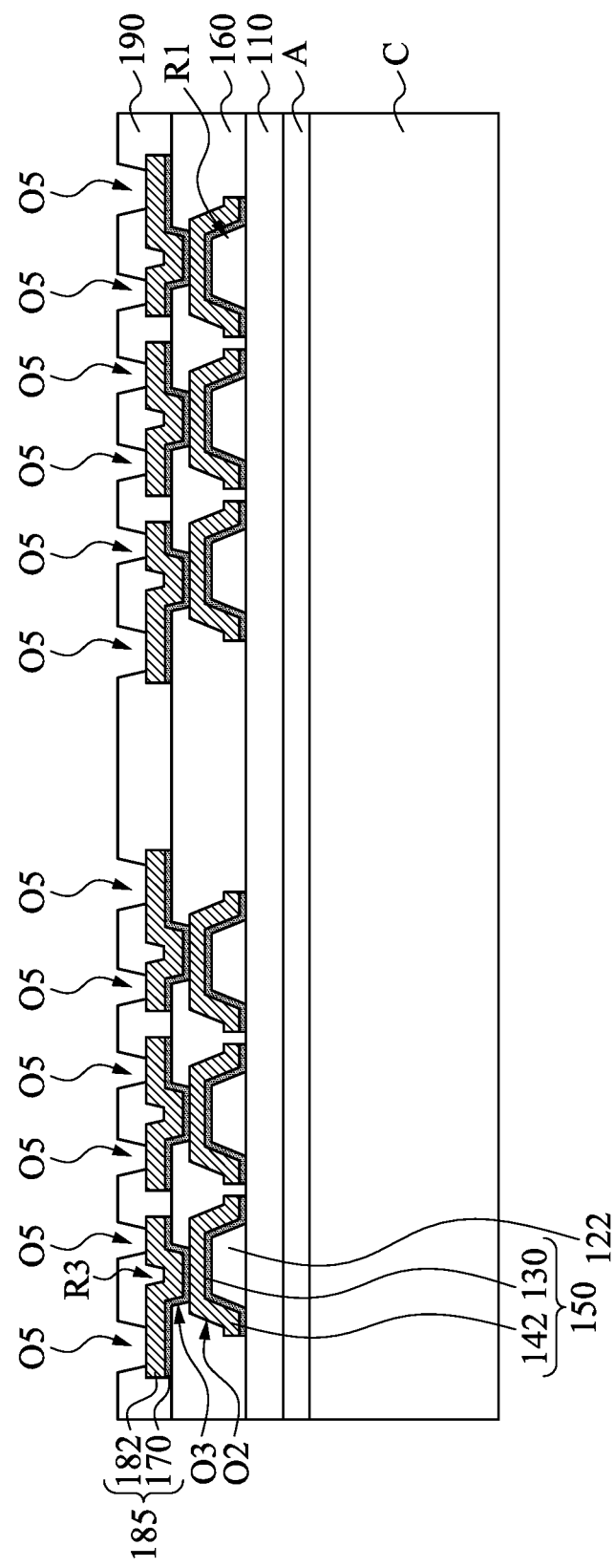

Reference is made to FIG. 13. A second dielectric layer 190 is formed over the RDLs 185 such that the RDLs 185 are embedded in the second dielectric layer 190. The second dielectric layer 190 may include a polymer such as polyimide, benzocyclobutene (BCB), polybenzoxazole (PBO), or the like, which is deposited using a spin coating process or a lamination process, as examples. Alternatively, the second dielectric layer 190 may include non-organic dielectric materials such as silicon oxide, silicon nitride, silicon carbide, silicon oxynitride, or the like. The second dielectric layer 190 is patterned using a lithography process. For example, a photoresist (not shown) may be formed over the second dielectric layer 190, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the second dielectric layer 190 are removed during the etch process to form openings O5, through which some portions of the second conductive features 182 are exposed. In some embodiments, the opening O5 tapers in the direction substantially toward the carrier C. The tapering profile of the opening O5 can be controlled by the etch process performed to the second dielectric layer 190. Patterned second dielectric layer 190 is partially embedded in the recesses R3 defined by the RDLs 185. For example, a portion of the dielectric layer 190 can be referred to as a dielectric structure embedded in the recess R3, and this embedded portion of the dielectric layer 190 and the opening O2 of the first dielectric layer 160 taper in substantially opposite directions. Afterwards, the photoresist is removed. In some embodiments, the openings O5 of the second dielectric layer 190 and the openings O3 of the first dielectric layer 160 may depend on an RDL routing rule. In some embodiments, the opening O5 of top dielectric layer 190 is smaller or equal to the opening O3 of the underlying dielectric layer 160.

Figure 14:
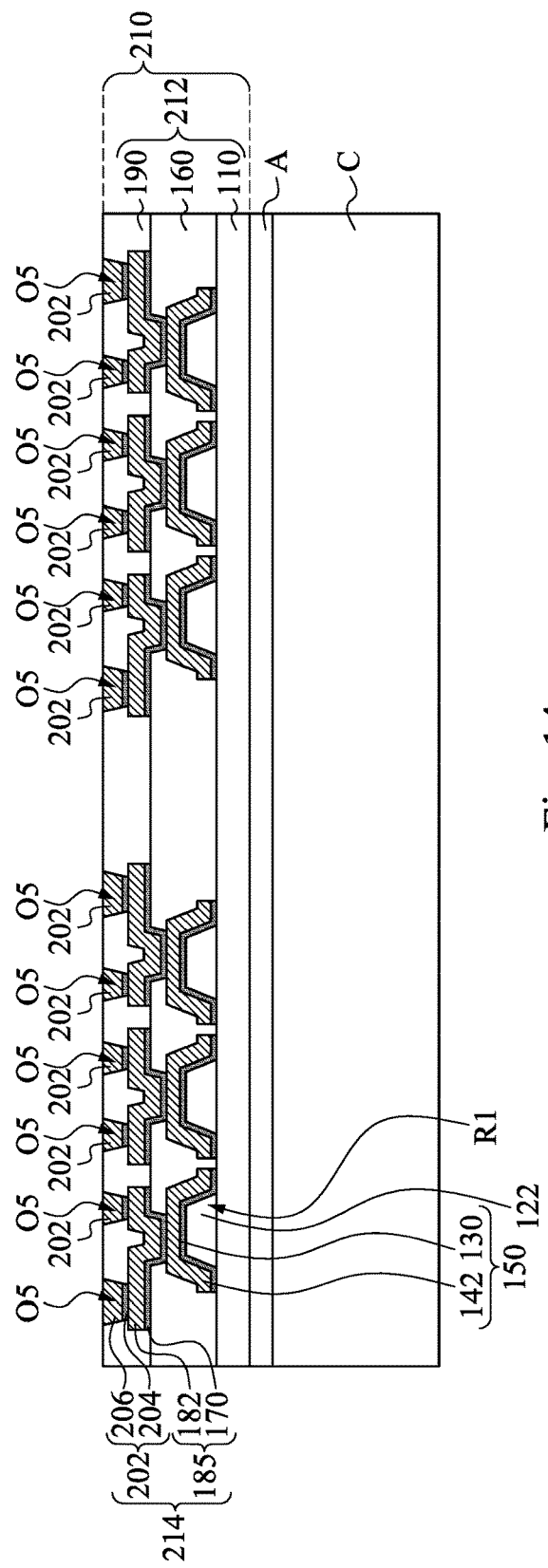

Reference is made to FIG. 14. Top contact pads 202 are respectively formed in the openings O5 of the second dielectric layer 190. Formation of the top contact pads 202 may exemplarily include forming a blanket seed layer 204, forming and pattering a photoresist over the blanket seed layer 204, performing a plating to form conductive features 206 in openings of the patterned photoresist, removing the photoresist, and performing a flash etching to remove the portions of the blanket seed layer 204 not covered by the conductive features 206. The conductive features 206 and the respective underlying portions of the seed layer 204 can be collectively referred to as top contact pads 202. In some embodiments, a planarization process, such as a grinding process or a chemical mechanical polish (CMP) process, may be performed to the top contact pads 202 and the second dielectric layer 190, so that top surfaces of the top contact pads 202 can be substantially level with that of the second dielectric layer 190, as illustrated in FIG. 14. In some embodiments, the top contact pad 202 may be copper bump or a cupper bump including a solder cap. The top contact pads 202 may include a metal or a metal alloy including aluminum, copper, tungsten, and/or alloys thereof. The first buffer layer 110, the first dielectric layer 160, the RDLs 185, the second dielectric layer 190 and the top contact pads 202 can be collectively referred to as a redistribution structure 210. In some embodiments, the first buffer layer 110, the first dielectric layer 160 and the second dielectric layer 190 can be referred to as a dielectric structure 212 of the redistribution structure 210. The RDLs 185 and the top contact pads 202 can be referred to as a wiring structure 214 of the redistribution structure 210. After the forming the redistribution structure 210 and prior to placing a semiconductor device thereon, an electrical test can be performed to the redistribution structure 210, which may be beneficial to address some issues (e.g., defect/reliability) before the placing the semiconductor device. In other words, the RDL-first process in accordance with the instant disclosure allows electrical test to be performed at an intermediate package, in which the semiconductor device is not placed yet, through the top contact pads 202 that are exposed on a top side of the redistribution structure 210, as examples.

Figure 15:
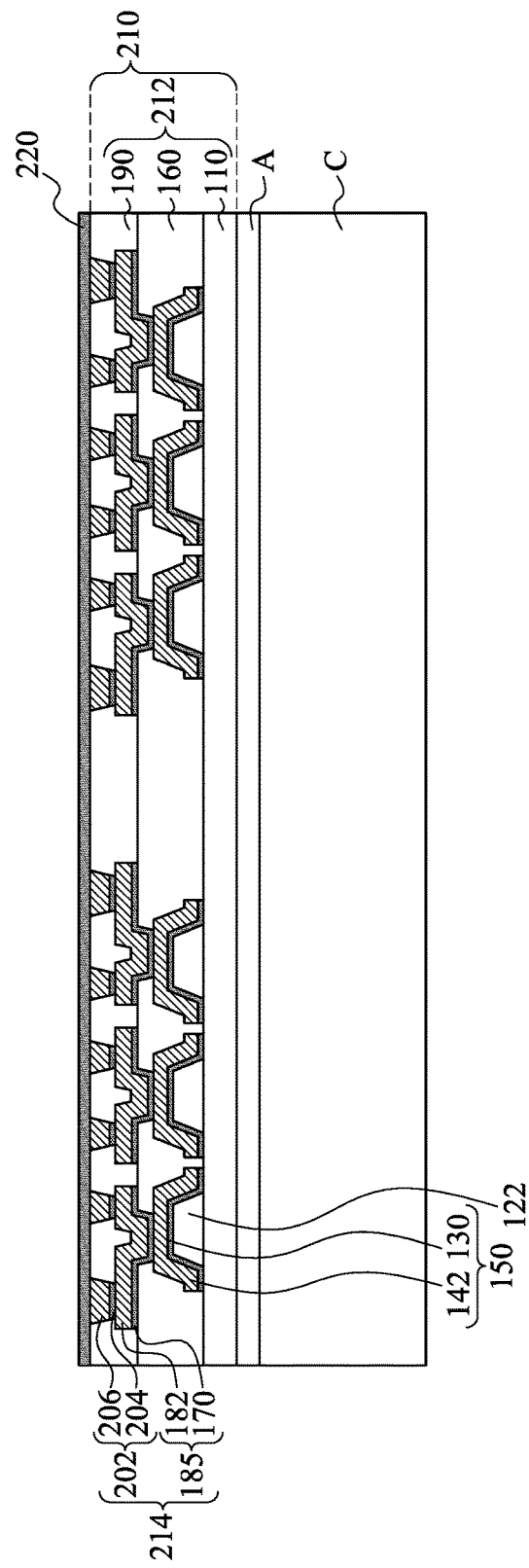

Reference is made to FIG. 15. A third seed layer 220 is formed on the redistribution structure 210, for example, through PVD or metal foil laminating. The third seed layer 220 may include copper, copper alloy, aluminum, titanium, titanium alloy, or combinations thereof. In some embodiments, the third seed layer 220 includes a titanium layer and a copper layer over the titanium layer. In alternative embodiments, the third seed layer 220 is a copper layer.

Figure 16:
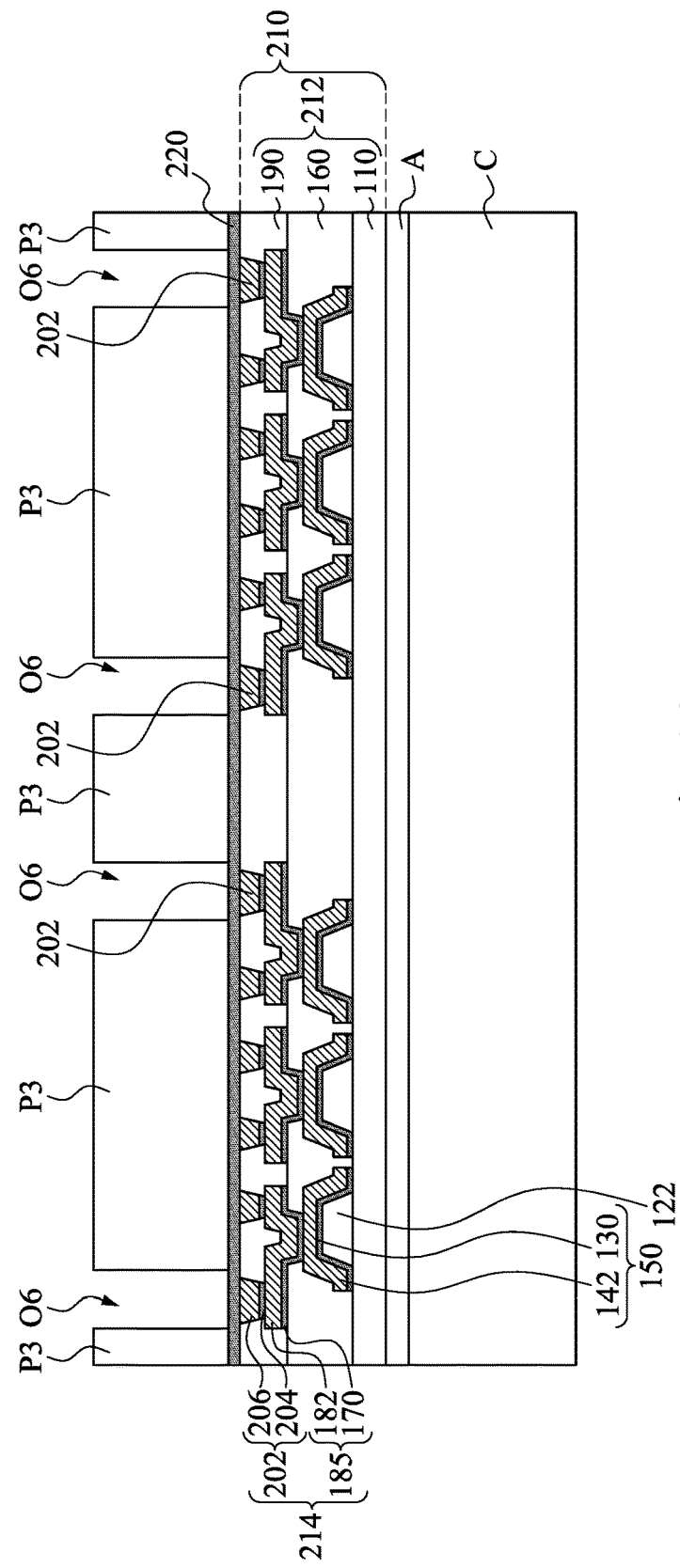

Reference is made to FIG. 16. A photoresist P3 is applied over the third seed layer 220 and is then patterned to expose some portions of the third seed layer 220. As a result, openings O6 are formed in the photoresist P3, through which some portions of the third seed layer 220 are exposed.

Figure 17:
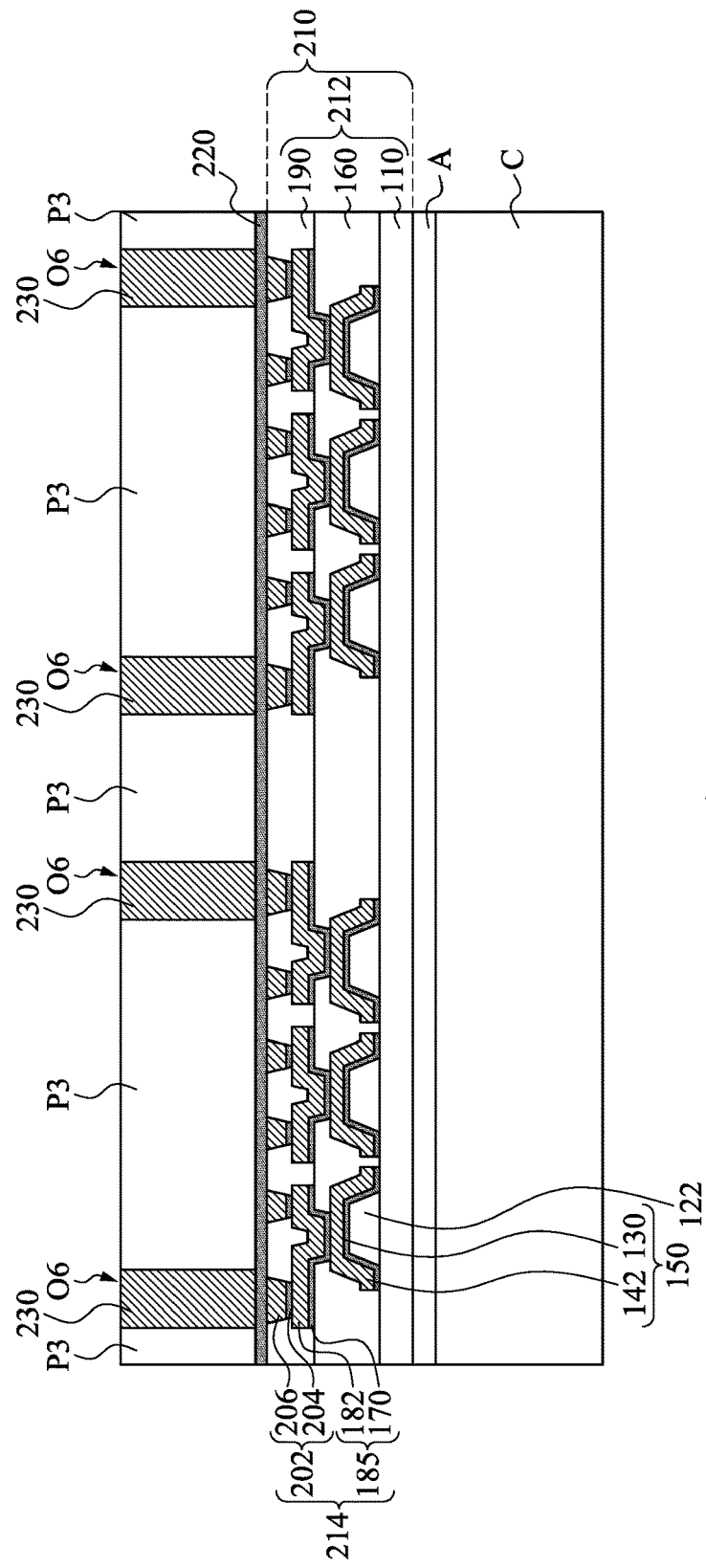
Figure 18:
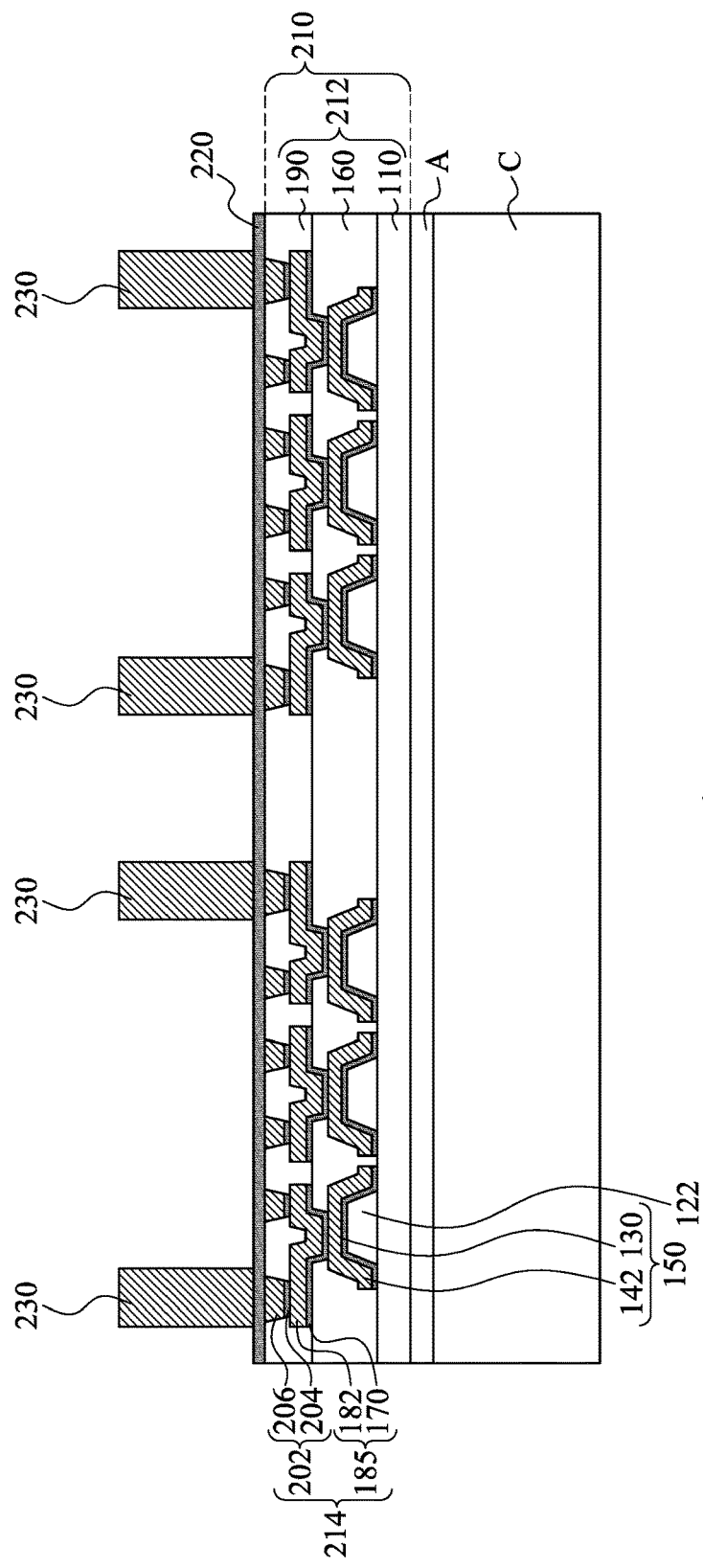

Reference is made to FIG. 17. Third conductive features 230 are respectively formed in the openings O6 of the photoresist P3 through, for example, plating, which may be electro plating, electro-less plating, or metal-paste printing. The third conductive features 230 are plated on the exposed portions of the third seed layer 220 underlying the openings O6, respectively. The third conductive features 230 may include copper, aluminum, tungsten, nickel, solder, silver or alloys thereof. Top-view shapes of the third conductive features 230 may be rectangles, squares, circles, or the like. Heights of the third conductive features 230 are determined by the thickness of the subsequently placed first semiconductor devices 250 (see FIG. 20), with the heights of the third conductive features 230 greater than the thickness of the first semiconductor devices 250 in some embodiments of the present disclosure. After the plating of the third conductive features 230, the photoresist P3 is removed, and the resulting structure is shown in FIG. 18. After the photoresist P3 is removed, some portions of the third seed layer 220 are exposed.

Figure 19:
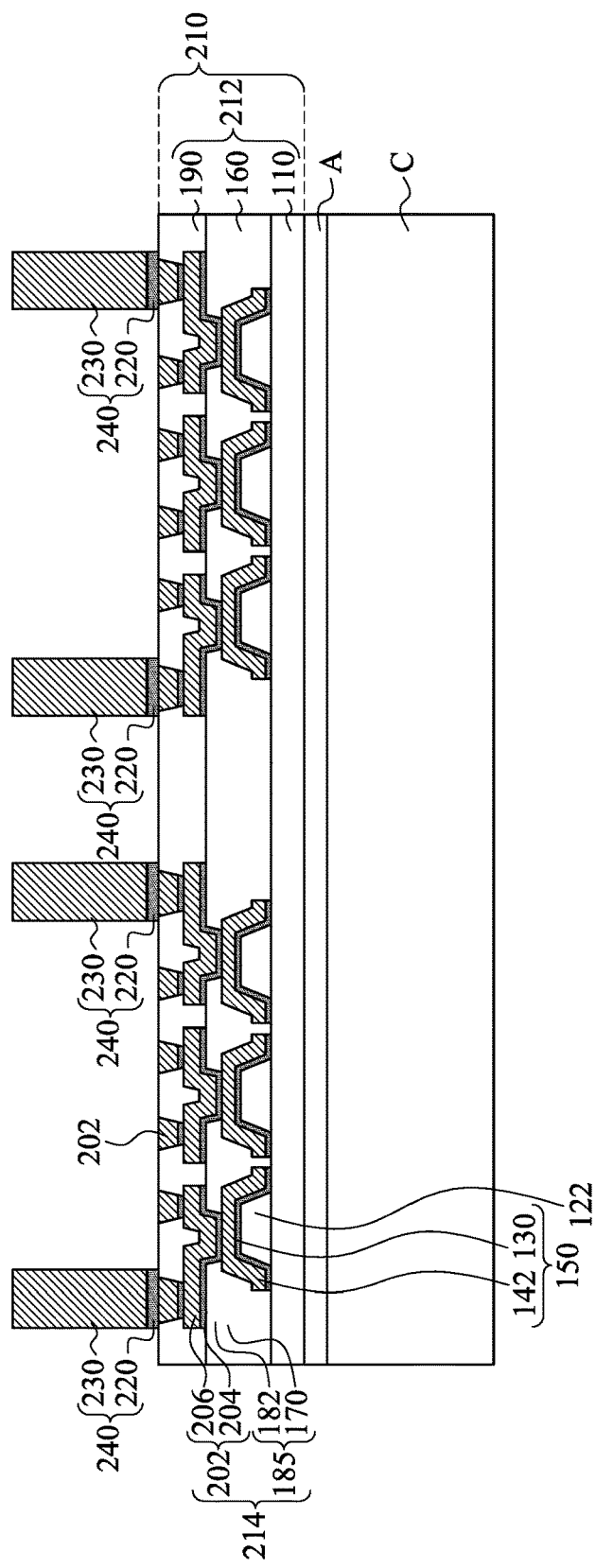

Reference is made to FIG. 19. An etch step is performed to remove the exposed portions of third seed layer 220 that are not covered by the third conductive features 230, wherein the etch step may include an anisotropic etching. Some portions of the third seed layer 220 that are covered by the third conductive features 230, on the other hand, remain not etched. Throughout the description, the third conductive features 230 and the remaining underlying portions of the third seed layer 220 are in combination referred to as through integrated fan-out (InFO) vias (TIVs) 240, which are also referred to as through-vias. Although the third seed layer 220 is shown as a layer separate from the third conductive features 230, when the third seed layer 220 is made of a material similar to or substantially the same as the respective overlying third conductive features 230, the third seed layer 220 may be merged with the third conductive features 230 substantially free from distinguishable interface therebetween. In alternative embodiments, there exist distinguishable interfaces between the third seed layer 220 and the overlying conductive features 230.

After the formation of the TIVs 240, some contact pads 202 not covered by the third conductive features 230 are exposed, so that the subsequently placed first semiconductor devices 250 can be electrically connected to the redistribution structure 210 through the pre-exposed contact pads 202. The method that forms the redistribution structure 210 before the first semiconductor devices 250 are placed can be referred to as a "RDL-first" process herein. In the intermediate package during the "RDL-first" process as shown in FIG. 19, the first semiconductor devices 250 are not placed yet, so an electrical test can be performed to the redistribution structure 210 and the TIVs 240, which is beneficial to address some issues (e.g., defect/reliability) before the first semiconductor devices 250 are placed. In some embodiments, the electrical test can be performed, for example, through the exposed top contact pads 202 of the redistribution structure 210, the TIVs 240 or combinations thereof. In this way, the redistribution structure 210 can be identified as a known good redistribution structure when it passes the electrical test.

Figure 20:
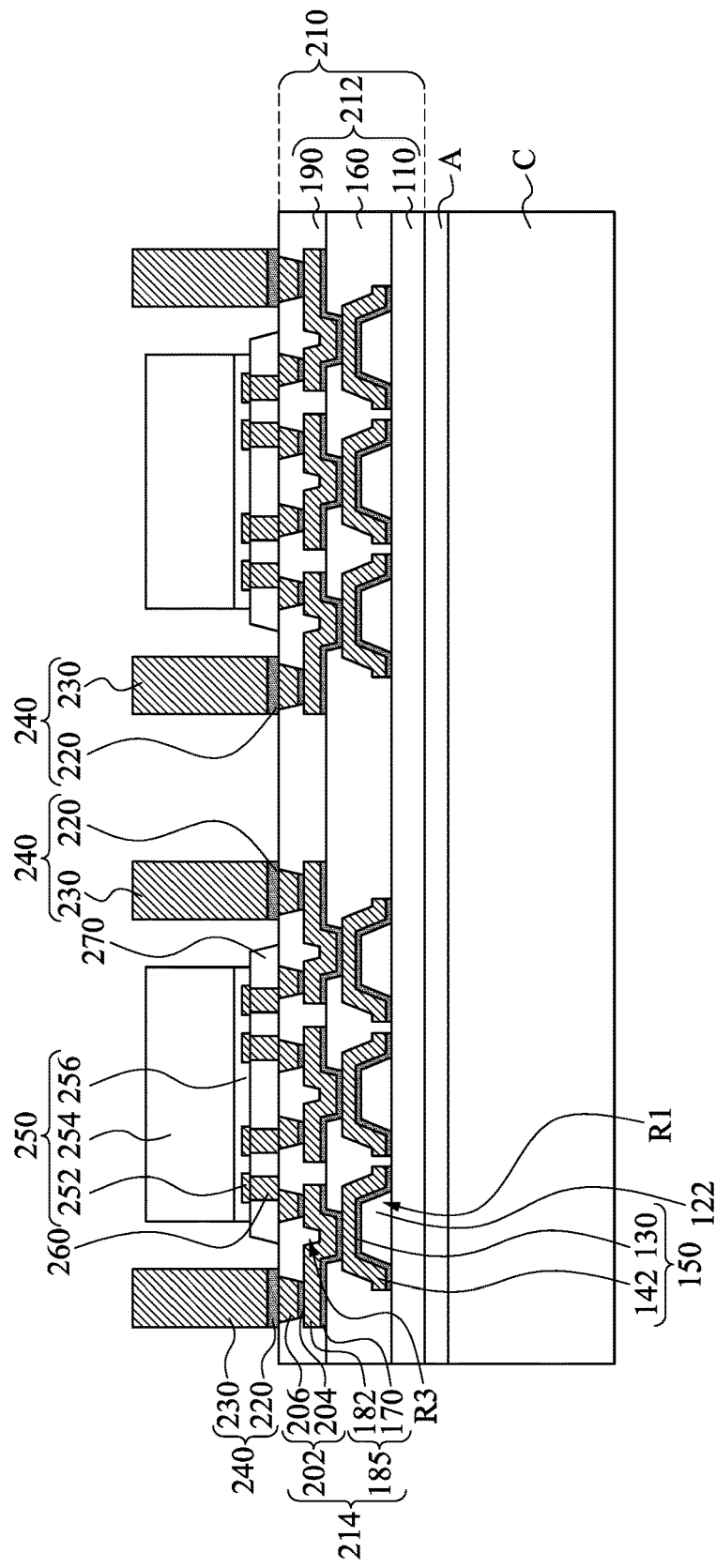

Reference is made to FIG. 20. First semiconductor devices 250 are disposed on or placed on the redistribution structure 210 using a pick-and place machine, manually or other suitable methods. The first semiconductor devices 250 can be electrically connected to some top contact pads 202 of the redistribution structure 210 not covered by the TIVs 240. For example, bonding pads 252 (such as copper pads) on the bottom portion of the first semiconductor devices 250 are electrically connected to the top contact pads 202. In other words, the first semiconductor devices 250 are disposed on the redistribution structure 210 using a "flip chip" approach; that is, the bonding pads 252 on the face of the first semiconductor devices 250 are "flipped" over so they are "face down", and the bonding pads 252 are connected to the contact pads 202 with conductive material. For example, the bonding pads 252 can be electrically and mechanically connected to the exposed contact pads 202 of the redistribution structure 210 through connectors 260. The connectors 260 may be solder bumps (e.g., balls), and these solder balls are in physical contact with the contact pads 202 to form solder-on-pad (SOP) connections. In some other embodiments, the contact pads 202 may be formed as traces, and the connectors 260 may include non-solder metal bumps. These non-solder metal bumps may include copper pillars, and may include one or more layers including nickel, gold, palladium, or other suitable materials. These non-solder metal bumps (e.g., alternative forms of connector 260) and the contact pads 202 may be bonded by solder to form bump-on-trace (BOT) connections. By the SOP connections or BOT connections formed by the connectors 260, the first semiconductor devices 250 may be in electrical connection with the redistribution structure 210.

After disposing the first semiconductor devices 250 on the redistribution structure 210, an electrical test such as a chip probe (CP) test can be performed. In this way, known good dies (KGDs) and/or known bad dies (KBDs) can be identified. Therefore, the KGDs can be remained on the redistribution structure 210, and KBDs can be reworked, replaced, removed, discarded, flagged or otherwise accounted for before the subsequent molding process. Moreover, since the redistribution structure 210 can be identified as a known good redistribution structure when it passes the pre-performed electrical test before first semiconductor devices 250 are placed, issues detected after the first semiconductor devices 250 are placed can be confirmed as due to the first semiconductor devices 250. That is, the "RDL-first" process, which forms the redistribution structure 210 prior to forming the first semiconductor devices 250, is advantageous to distinguish that the electronic issues are caused by the redistribution structure 210 or the first semiconductor devices 250.

As shown in FIG. 20, in the structure formed by the "RDL-first" process according to some embodiments, the recesses R1 defined by the contact pads 150 and the recesses R3 defined by the RDLs 185 of the redistribution structure 210 taper in substantially opposite directions. Stated differently, the recesses R1 and R3 expand in substantially opposite directions. For example, the recesses R1 defined by the contact pads 150 taper in a direction substantially toward the first semiconductor devices 250, and the recesses R3 defined by the RDLs 185 taper in a direction substantially farther away from the first semiconductor devices 250. That is, the recesses R1 defined by the contact pads 150 expand in the direction substantially farther away from the first semiconductor devices 250, and the recesses R3 defined by the RDLs 185 expand in the direction substantially toward the first semiconductor devices 250.

A first underfill layer 270 can be optionally formed between the first semiconductor device 250 and the redistribution structure 210 and among the connectors 260. The first underfill layer 270 may be exemplarily dispensed as a liquid using a capillary underfill ("CUF") approach. A resin or epoxy liquid is flowed beneath the first semiconductor device 250 and fills the space between the first semiconductor device 250 and the redistribution structure 210. Room temperature, UV, or thermal curing may be used to cure the first underfill layer 270. The first underfill layer 270 can provide mechanical strength and stress relief at least to the overlying first semiconductor device 250 and the underlying redistribution structure 210. In some embodiments, the first underfill layer 270 is the same as a subsequently formed molding compound 280 (see FIG. 21) that molds the first semiconductor devices 250. That is, the space between the first semiconductor devices 250 and the redistribution structure 210 may be filled by the subsequently formed molding compound 280.

In some embodiments, the first semiconductor devices 250 are unpackaged semiconductor devices, i.e. logic device dies or memory device dies. For example, the first semiconductor devices 250 may be logic device dies including logic transistors therein. In some exemplary embodiments, the first semiconductor devices 250 are designed for mobile applications, and may be central computing unit (CPU) dies, power management integrated circuit (PMIC) dies, transceiver (TRX) dies, or the like. At least one of the first semiconductor devices 250 includes a semiconductor substrate 254 (a silicon substrate, for example) and a dielectric layer 256 under the semiconductor substrate 254. The dielectric layer 256 is formed on the bottom of the respective first semiconductor device 250, with the bonding pads 252 having at least upper portions in the dielectric layer 256. The bottom surfaces of the bonding pads 252 may be substantially level with the bottom surface of the dielectric layer 256 in some embodiments. Alternatively, the dielectric layer is not formed, and the bonding pads 252 protrude from a bottom dielectric layer (not shown) of the first semiconductor device 250.

Figure 21:
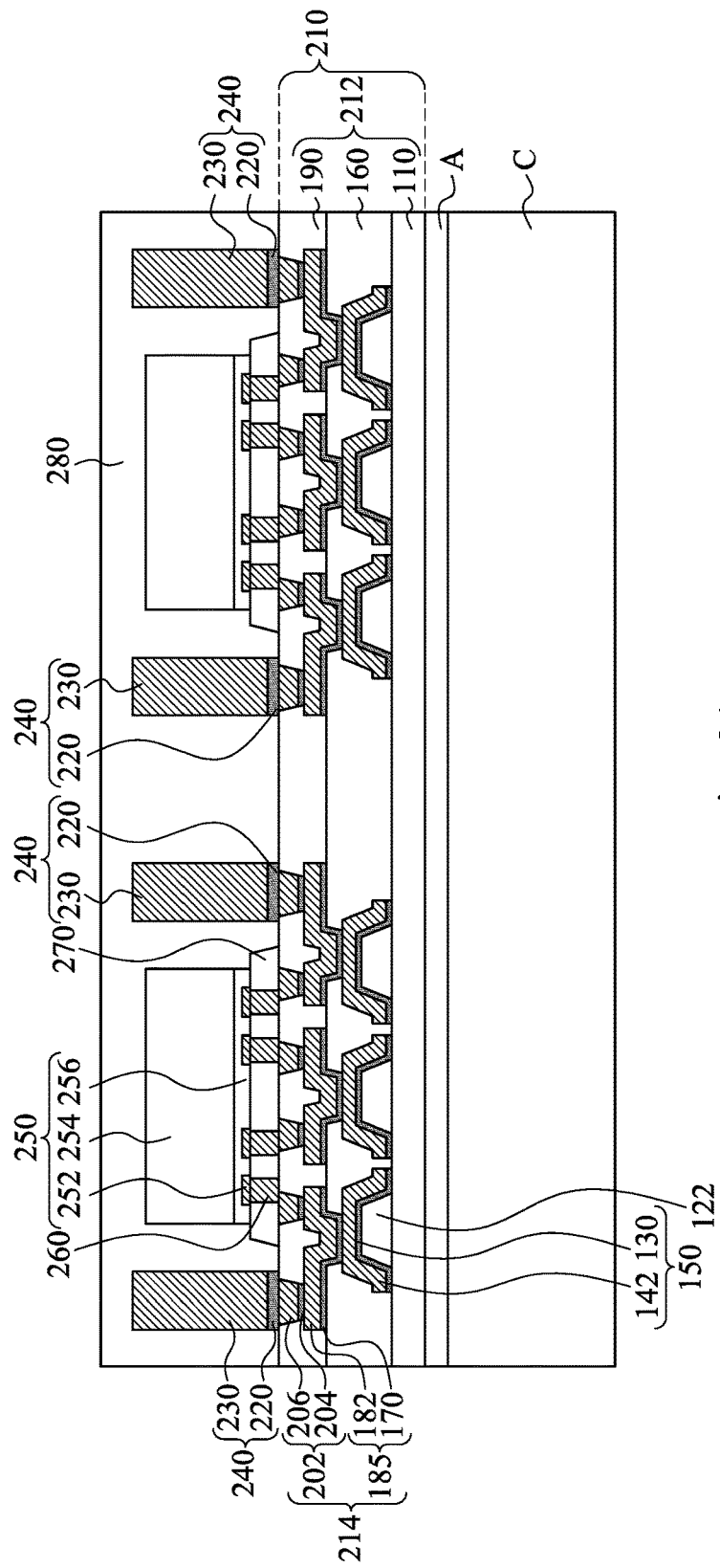

Reference is made to FIG. 21. A molding material (or molding compound) 280 is molded on the redistribution structure 210, the TIVs 240 and the first semiconductor devices 250. The molding material 280 fills gaps between the first semiconductor devices 250 and the TIVs 240, and may be in contact with the redistribution structure 210, especially the second dielectric layer 190 of the redistribution structure 210. The top surface of the molding material 280 is higher than the top surfaces of the semiconductor substrates 254 and the TIVs 240.

In some embodiments, the molding material 280 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 22:
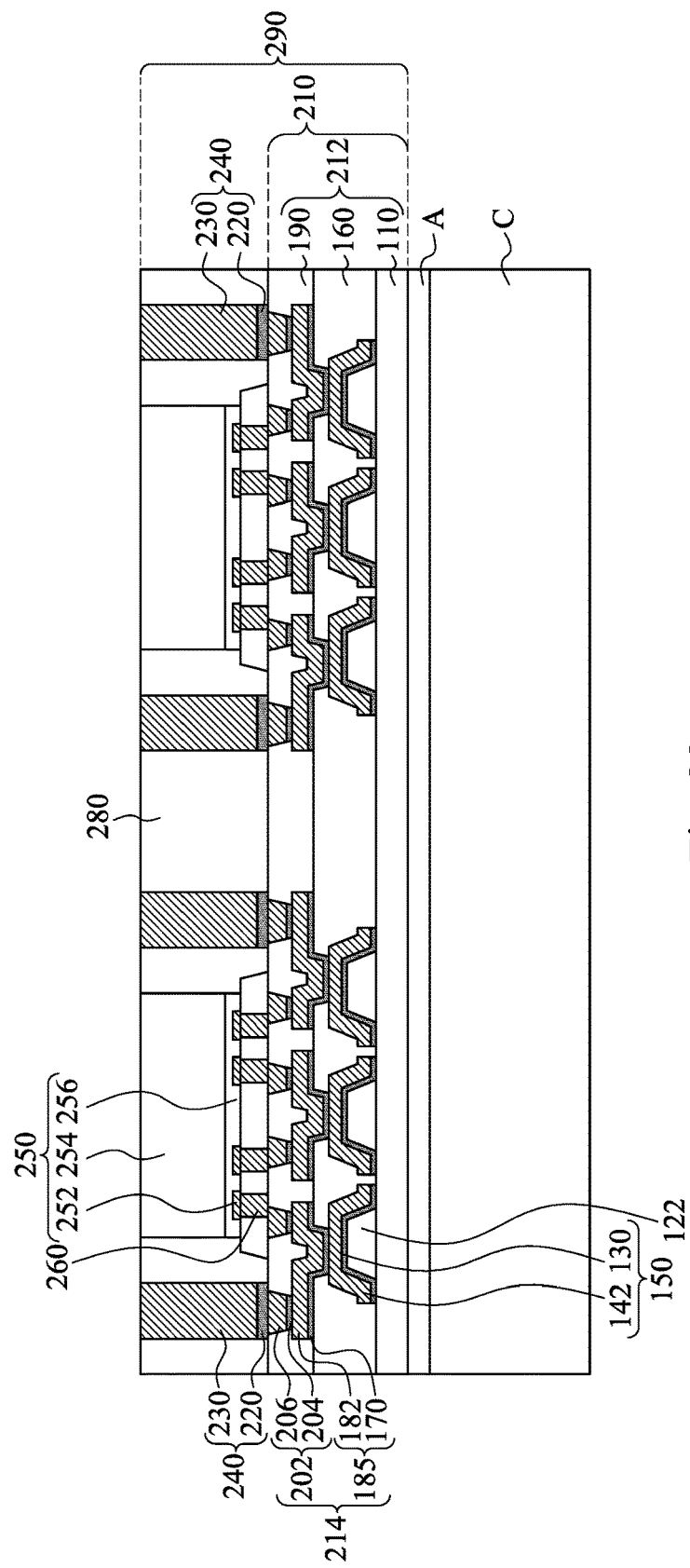

Next, a planarization process, such as grinding, is performed to thin the molding material 280, until the top surfaces of the semiconductor substrate 254 and the TIVs 240 are exposed. The resulting structure is shown in FIG. 22, in which the molding material 280 is in contact with sidewalls of the first semiconductor devices 250 and the TIVs 240. Due to the grinding, the top surfaces of the semiconductor substrates 254 are substantially level (coplanar) with top surfaces of the TIVs 240, and are substantially level (coplanar) with the top surface of the molding material 280. As a result of the grinding, conductive residues such as metal particles may be generated, and left on the top surface of the structure shown in FIG. 22. Accordingly, after the grinding, a cleaning may be performed, for example, through a wet etching, so that the conductive residues are removed. Throughout the description, the combined structure including the contact pads 150, the redistribution structure 210, the TIVs 240, the first semiconductor devices 250 and the molding material 280 is referred to as a TIV package 290, which may be a composite wafer.

Figure 23:
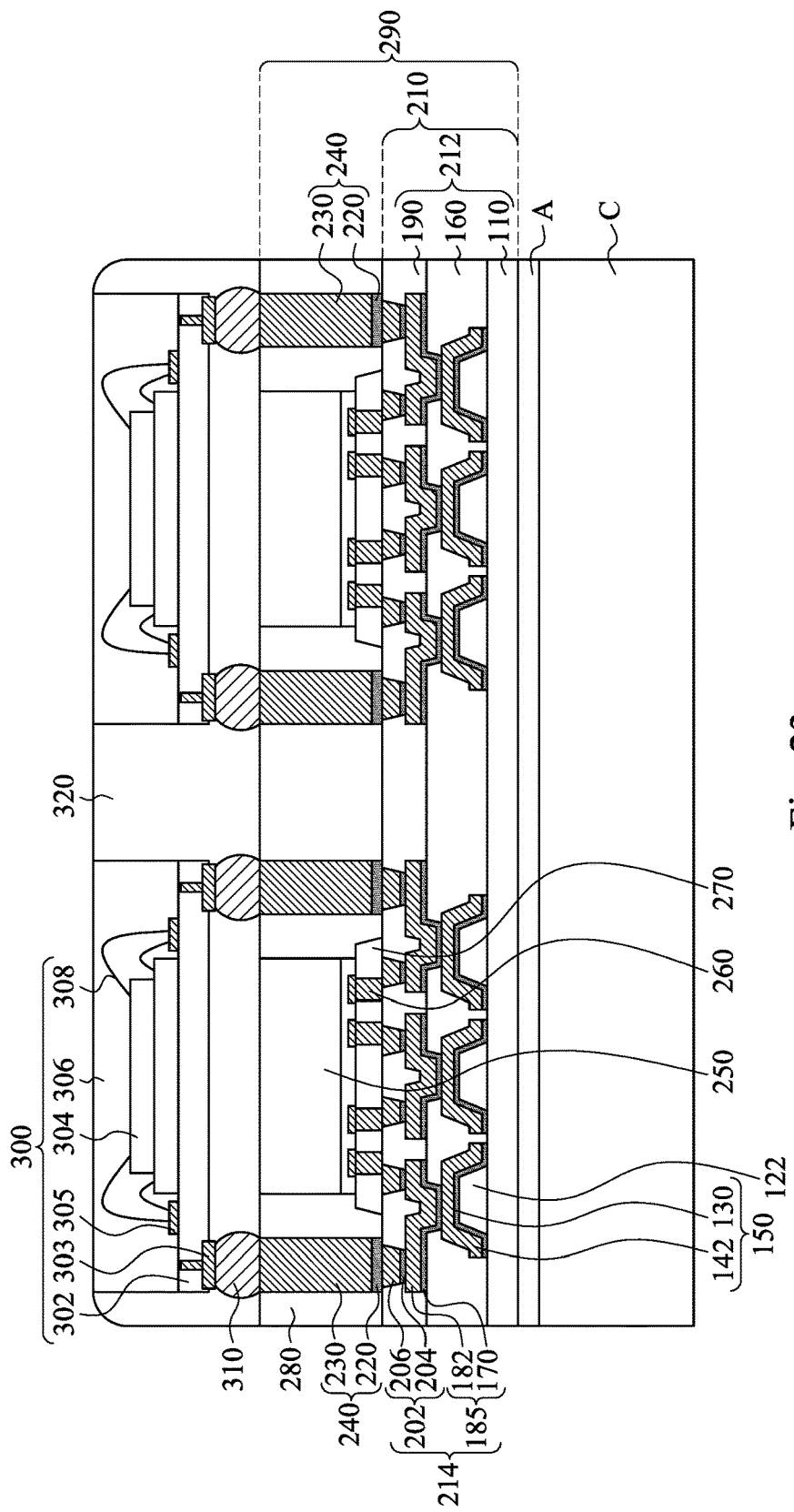

Reference is made to FIG. 23. Second semiconductor devices 300 are attached to the TIV package 290. Connectors 310 bond the second semiconductor devices 300 to the exposed portions of the TIVs 240, respectively. In some embodiments, the connectors 310 may be solder or other conductive materials, which may provide electrical connections to the second semiconductor devices 300 and the TIV package 290. The connectors 310 may be solder balls, as shown in FIG. 23, but the embodiments are not limited to the use of solder balls, the connectors 310 could be copper columns, copper studs, controlled collapse chip connectors ("C4"), or other connectors suitable for connecting components to an underlying package or device. Further, the term "solder" as used in this description is not limited to any particular type and lead containing, or lead free, solder may be used. A solder ball of lead and tin (Pb/Sn) or Pb and additional materials may be used. In the alternative, lead free compositions including, as a non-limiting example, tin, silver and copper ("SAC") may be used. Eutectic compositions may be used to form the connectors 310. The shape of the connectors 310 is also not limited to a "ball" shape and columns, pillars, ovoids, towers, squares, rectangles and other shapes may be used.

The second semiconductor devices 300 may be packaged semiconductor devices. For example, at least one of the second semiconductor devices 300 includes a substrate 302, at least one die 304 and a cover 306. The die 304 is present between the cover 306 and the substrate 302. The cover 306 covers the die 304 and the substrate 302. The cover 306 may be an overmolding layer formed, for example, by compression molding of a thermoset molding compound, to protect the die 304 and other component underlying the cover 306 from moisture and thermal stresses. Other overmolding materials may be used such as resins and epoxies. The die 304 is electrically connected to the substrate 302. The substrate 302 may be a coreless substrate or include a core therein. The substrate 302 includes bottom bonding pads 303 that are bonded to the connectors 310.

In some embodiments, the second semiconductor devices 300 may be memory devices, such as a static random access memory (SRAM) or dynamic random access memory (DRAM) device. At least one of the second semiconductor devices 300 may include a plurality of stacked memory dies 304. More memory dies 304 may be mounted to increase the size of the memory provided, or alternatively a single memory die may be used. Other types of second semiconductor devices 300 may be present on TIV package 290 as well. In some embodiments, second semiconductor devices 300 may include at least one bonding wire 308. The bonding wire 308 electrically connects the die 304 to a top bonding pad 305 on the substrate 302. However, in alternative arrangements, a bottom one of the stacked memory dies 304 may be disposed on the substrate 302 using a "flip chip" approach and may be bonded to lands on the central portion of the substrate 302 using solder bumps or copper connections. In some embodiments, a memory module of several vertically stacked dies may be formed as a component, using for example through via connections to couple the stacked memory dies to form a memory module, and the bottom memory die in the module may be flip chip mounted to the substrate 302.

A second underfill layer 320 can be at least formed among the second semiconductor devices 300, the TIV package 290 and the connectors 310. The second underfill layer 320 may be exemplarily dispensed as a liquid using a capillary underfill ("CUF") approach. A resin or epoxy liquid is flowed beneath the second semiconductor devices 300 and fills the space among the second semiconductor devices 300 and the TIV package 290. The second underfill layer 320 may overfill the space among the second semiconductor devices 300 and the TIV package 290 and is present on sidewalls of the second semiconductor devices 300, as shown in FIG. 23. Room temperature, UV, or thermal curing may be used to cure the second underfill layer 320. The second underfill layer 320 can provide mechanical strength and stress relief to at least the second semiconductor devices 300 and the TIV package 290.

Figure 24:
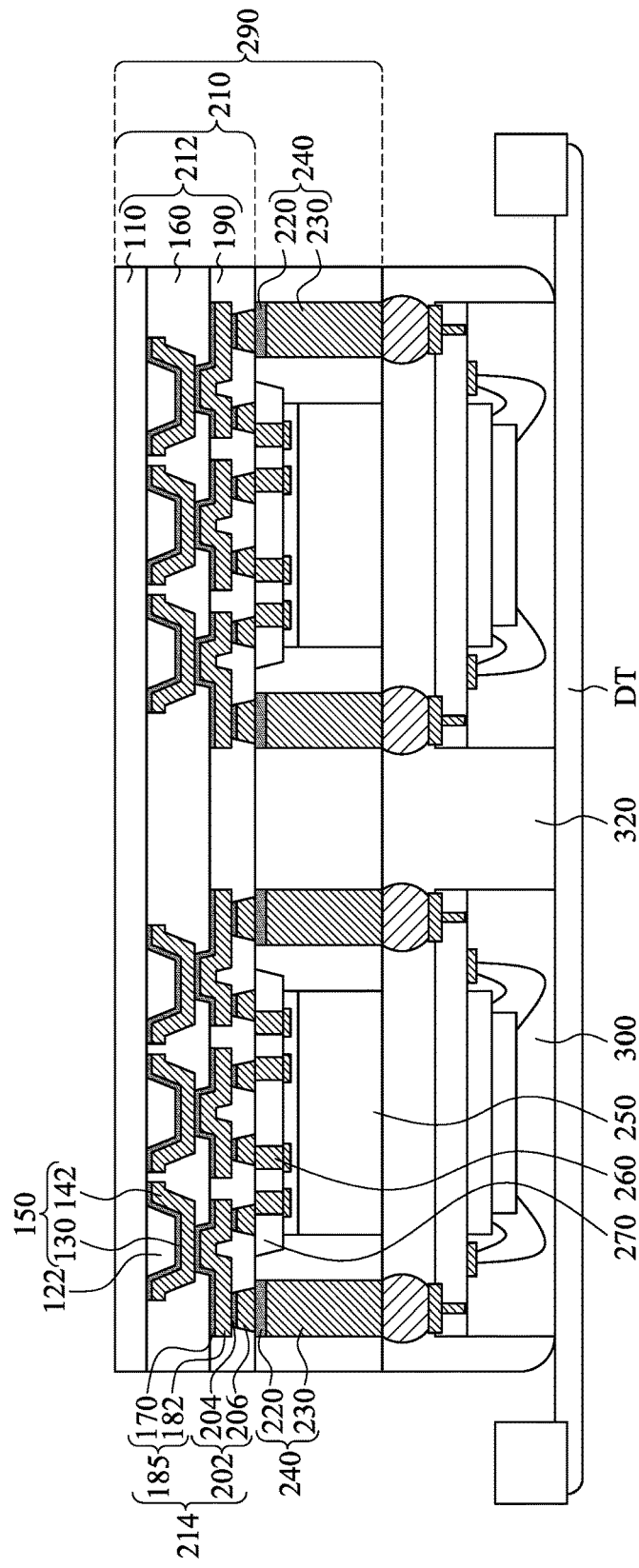

Reference is made to FIG. 24. The TIV package 290 is de-bonded from the carrier C. The adhesive layer A is also cleaned from the TIV package 290. As a result of the removal of the adhesive layer A, the first buffer layer 110 of the redistribution structure 210 is exposed. Referring to FIG. 24, the TIV package 290 with the second semiconductor devices 300 and the second underfill layer 320 thereon is further adhered to a dicing tape DT. In some embodiments, a laminating film (not shown) can be placed onto the exposed first buffer layer 110, wherein the laminating film may include SR, ABF, backside coating tape, or the like. In alternative embodiments, no laminating film is placed over the first buffer layer 110.

Figure 25:
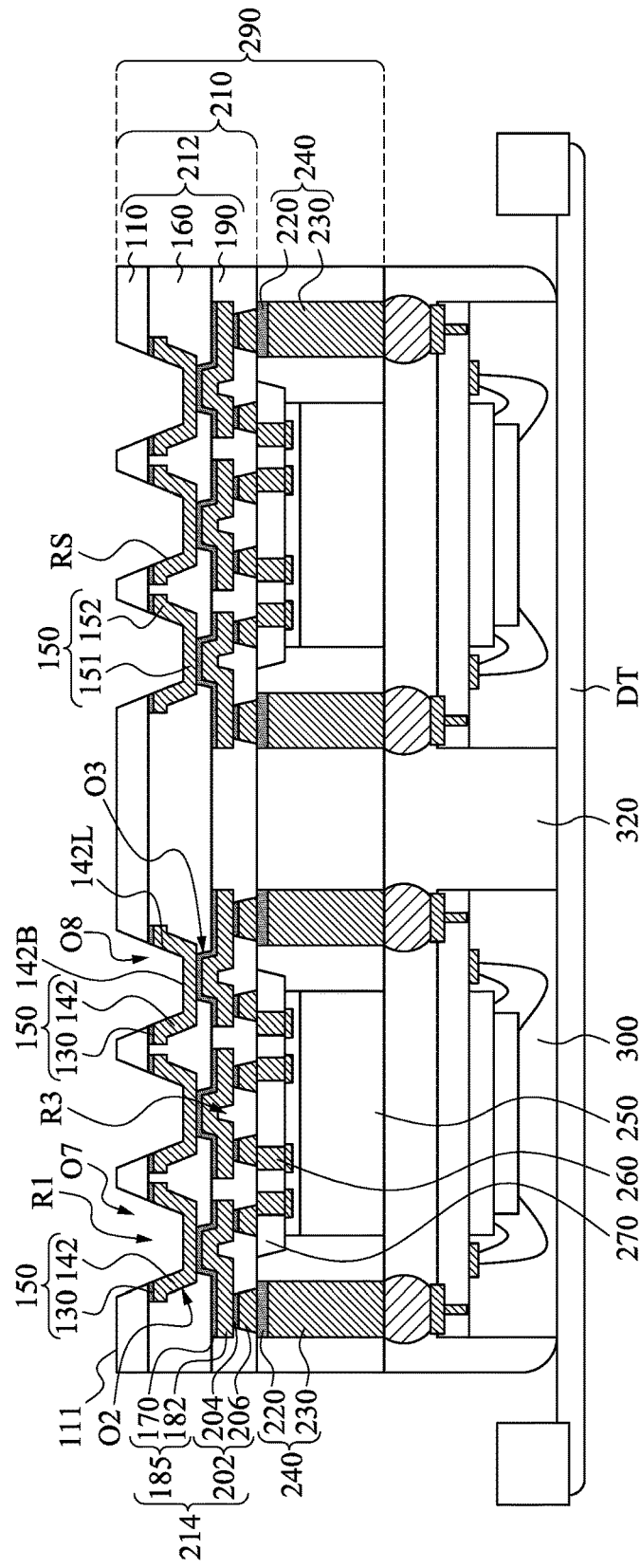

Reference is made to FIG. 25. Openings O7 are formed in the first buffer layer 110 of the redistribution structure 210, and the protrusions 122 underlying the openings O7 are removed as well. After the removal of the protrusions 122, the recesses R1 defined by the contact pads 150 are exposed by the openings O7, so as to receive subsequently formed conductive balls 330 (See FIG. 26). In some embodiments, a laser drilling process is performed to form the openings O7 and remove the protrusions 122. That is, the openings O7 can be referred to as laser drilled openings. The laser drilling process may create a jagged profile or a rough profile, e.g., of a sidewall of the openings O7, a sidewall of the recesses R1, or combinations thereof. In other words, the laser drilling process may expose an inner surface of the opening O7, an inner surface of the recess R1 or combinations thereof, and these surfaces have roughness greater than other portions of the first buffer layer 110 that do not undergo the laser drilling process. For example, the first buffer layer 110 has a top surface 111 distal to or geometrically farthest away from the semiconductor devices 250. The surface 111 coincide with the inner surface of the opening O7. The surface 111 is not drilled and thus has a roughness less than that of the inner surface of the opening O7, the inner surface of the recess R1 or combinations thereof. In some other embodiments, photolithography processes may also be used to form the openings O7 and remove the protrusions 122. In some embodiments, the openings O7 are arranged in a grid pattern of rows and columns, and the openings O7 and the recesses R1 have substantially the same arrangement, so that conductive bumps subsequently formed in the openings O7 and the recesses R1 can form the BGA.

In some embodiments, portions of the first seed layer 130 underlying the protrusions 122 are removed as well, so that portions of the first conductive features 142 is exposed. Stated differently, at least a portion of the conductive feature 142 is free from coverage of the first seed layer 130. In other words, the conductive feature 142 includes a bottom recess surface 142B and an inner lateral recess surface 142L coinciding with each other. The bottom recess surface 142B and the inner lateral recess surface 142L cooperatively define the recess R1. The bottom recess surface 142B and the inner lateral recess surface 142L are free from coverage of the first seed layer 130. Because a portion of the contact pad 150 is covered by seed layer 130, and other portion of the contact pad 150 is uncovered by seed layer 130, these portions of the contact pad 150 may have different thickness. For example, the contact pad 150 may include a cup-shaped portion (or metal cup) 151 and a ledge 152. The ledge 152 extends from an edge of the cup-shaped portion 151, or alternatively stated, the ledge 152 protrudes from an outer side of the cup-shaped portion 151. The ledge 152 includes the conductive feature 142 and the see layer 130, and a wall of the cup-shaped portion 151 is free from coverage of the see layer 130, and hence the ledge 152 may be thicker than the wall of the cup-shaped portion 151. After removing the portions of the first seed layer 130, openings O8 are formed in the first seed layer 130, so that the subsequently formed conductive bump (e.g., balls 330) can be placed in the recesses R1 through the openings O8. In some embodiments, the first seed layer 130 may include a titanium layer, the first conductive feature 142 may include a copper feature, and an etch step is performed to remove the titanium layer, so that the copper feature can be exposed.

As shown in FIG. 25, in the structure formed by the "RDL-first" process according to some embodiments, the openings O7 of the first buffer layer 110 and openings O3 of the dielectric layer 160 taper in substantially opposite directions. Stated differently, the openings O7 and O3 expand in substantially opposite directions. For example, the openings O7 of the first buffer layer 110 taper in a direction substantially toward the first semiconductor devices 250, and the openings O3 receiving the RDLs 185 taper in a direction substantially farther away from the first semiconductor devices 250. That is, the openings O7 of the first buffer layer 110 expand in the direction substantially farther away from the first semiconductor devices 250, and the openings O3 expand in the direction substantially toward the first semiconductor devices 250.

Figure 26:
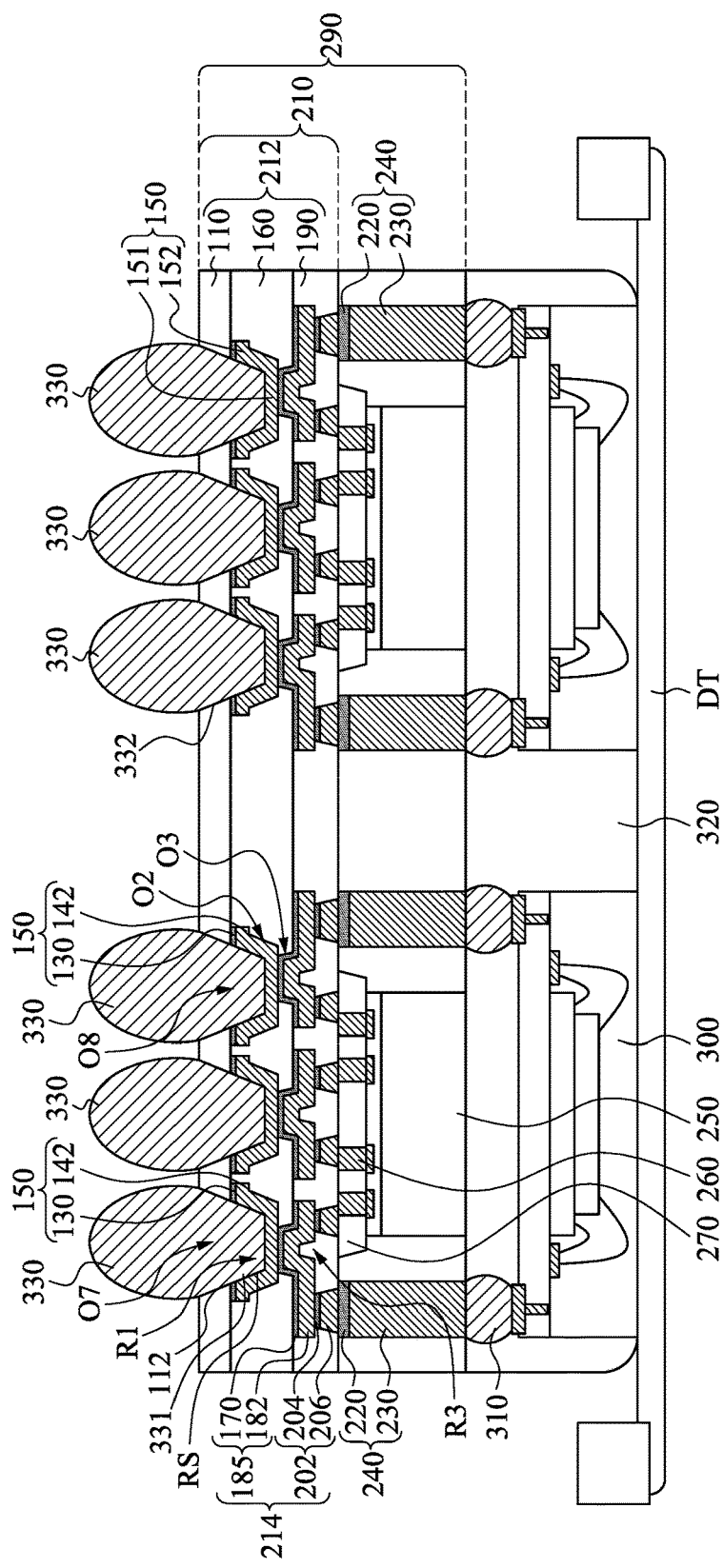

Reference is made to FIG. 26. Conductive bumps, such as conductive balls 330, are formed on the exposed portions of the first conductive features 142 of the contact pads 150. In other words, the conductive balls 330 are respectively in contact with the first conductive features 142 of the contact pads 150, so that the conductive balls 330 can be electrically connected to the contact pads 150. As such, the conductive balls 330 can be electrically coupled to the RDLs 185 via the contact pads 150. The contact pads 150 can therefore be referred to as under bump metallization (UBM) structures or layers. The formation of the conductive balls 330 may include placing solder balls in the openings O7 of the buffer layer 110 and the recesses R1 defined by the contact pads 150, and then reflowing the solder balls. Therefore, the conductive ball 330 is partially embeddedly retained in the recess R1 defined by the contact pad 150 and the opening O7 of the buffer layer 110. Since the openings O7 and the recesses R1 are arranged in a grid pattern of rows and columns, the conductive balls 330 can be arranged in a grid pattern of rows and columns as well and thus form the BGA. In the embodiments where the openings O8 of the first seed layer 130 are formed, the conductive balls 330 are present on or in contact with the first conductive features 142 of the contact pads 150 through the openings O8 defined by the first seed layer 130, respectively. Since the conductive ball 330 is at least partially embeddedly retained in the recess R1 defined by the contact pad 150, the contact pad 150 provides a larger non-planar contact surface in contact with the conductive balls 330. A larger contact interface area between the contact pad 150 and the conductive ball 330 helps to prevent the generation of crack at the interface region there-between. As a structurally result of such arrangement, a portion of the conductive ball 330 may be cupped or surrounded by the contact pad 150, so as to reduce crack at the interface between the conductive balls 330 and the contact pads 150.

In some embodiments, the conductive ball 330 includes an embedded portion 331 in the opening O2 of the first dielectric layer 160. The embedded portion 331 and the opening O3 of the first dielectric layer 160 taper in substantially opposite directions since the openings O2 and O3 taper in substantially opposite directions. More particularly, the embedded portion 331 is embeddedly retained in the recess R1 defined by the contact pad 150. The embedded portion 331 and the recess R3 defined by the RDL 185 taper in substantially opposite directions since the recesses R1 and R3 respectively taper in substantially opposite directions. In other words, the embedded portion 331 of the conductive ball 330 fills the recess R1 and tapers in the direction substantially toward the first semiconductor device 250. In some embodiments, the embedded portion 331 of the conductive ball 330 is embedded in the opening O7 of the first buffer layer 110 as well. In other words, the embedding portion 331 of the conductive ball 330 tapers in the direction substantially toward the first semiconductor device 250.

In some embodiments, the conductive ball 330 includes a sidewall 332, and a portion of the contact pad 150 is present on the sidewall 332. The portion of the contact pad 150 present on the sidewall 332 defines the recess R1 that receives the conductive ball 330. In some embodiments, the sidewall 332 of the conductive ball 330 abuts on or is in contact with the portion of the contact pad 150. Stated differently, the conductive ball 330, especially the sidewall 332 of the conductive ball 330, abuts on a sidewall RS of the recess R1. In some embodiments, a portion of the conductive ball 330 is fixedly enclosed by the redistribution structure 210, especially the first buffer layer 110 of the redistribution structure 210, so as to reduce the crack at the interface between the conductive balls 330 and the contact pads 150. In other words, a portion of the redistribution structure 210, especially the first buffer layer 110, is present on the sidewall 332 of the conductive ball 330. The portion of the redistribution structure 210 present on the sidewall 332 defines the opening O7 that receives the conductive ball 330. In some embodiments, the sidewall 332 of the conductive ball 330 abuts on or is in contact with the portion of the redistribution structure 210. Stated differently, the opening O7 of the first buffer layer 110 of the redistribution structure 210 includes a sidewall 112 that is adjacent to the sidewall RS of the contact pad 150, and the conductive ball 330, especially the sidewall 332 of the conductive ball 330, abuts on the sidewall 112 of the opening O7. By using such configurations, it is advantageous to prevent crack at the interface between the conductive balls 330 and the contact pads 150.

Figure 27:
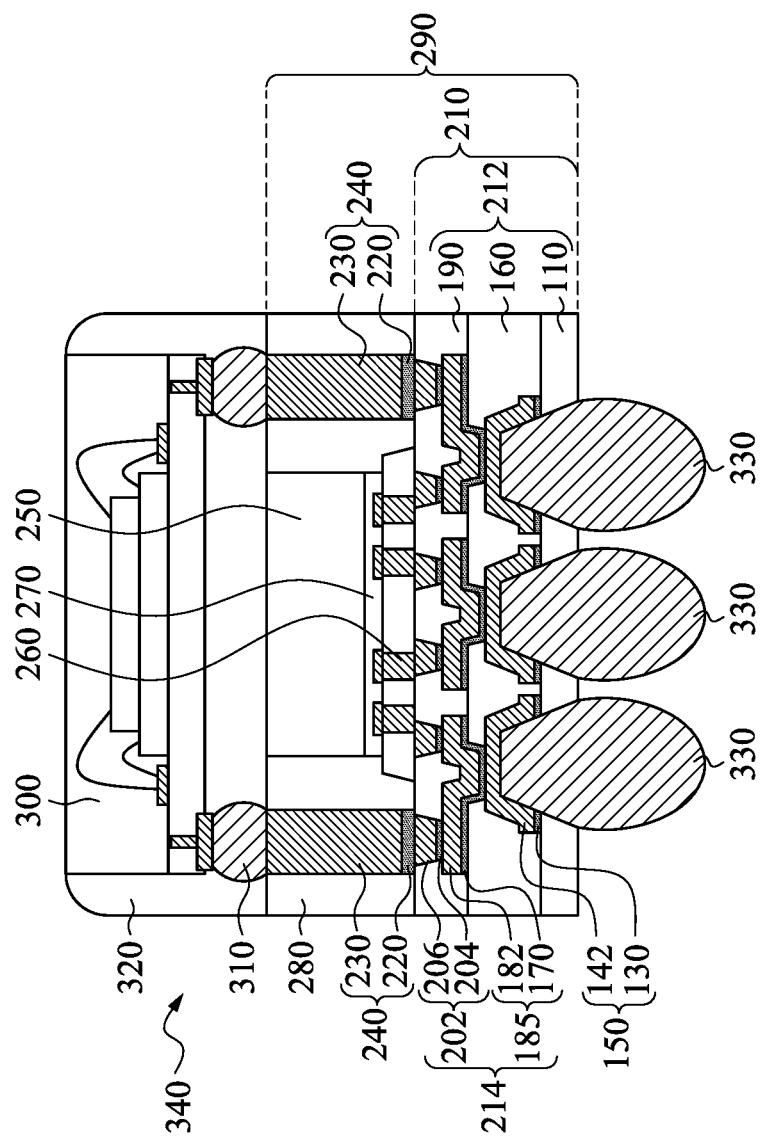

Reference is made to FIG. 27. A singulation process is performed to saw a combination of the TIV package 290, the second semiconductor devices 300, and the second underfill layer 320 into a plurality of individual package structures 340. The dicing tape DT can be removed as well.

Figure 28:
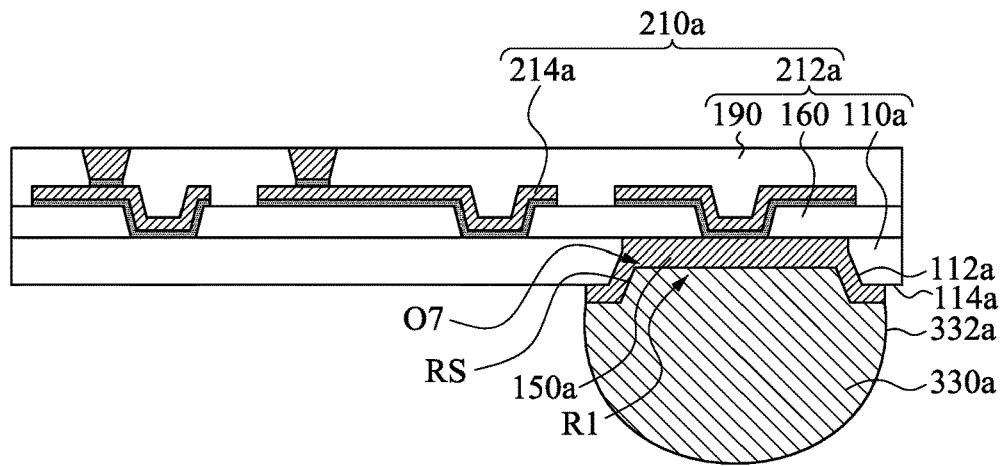
FIG. 28 is a fragmentary cross-sectional view of a package structure in accordance with some embodiments of the present disclosure.

FIG. 28 is a fragmentary cross-sectional view of a package structure in accordance with some embodiments of the present disclosure, in which a redistribution structure 210a, a contact pad 150a and a conductive ball 330a are shown. As shown in FIG. 28, the redistribution structure 210a includes a dielectric structure 212a and a wiring structure 214a present in the dielectric structure 212a. The dielectric structure 212a includes a buffer layer 110a that is proximal to conductive ball 330a. A portion of the contact pad 150a covers a portion of a bottom surface 114a of the buffer layer 110a, and the contact pad 150a defines a recess R1 therein. At least a portion of the conductive ball 330a is embeddedly retained in the recess R1, and this portion of the conductive ball 330a is cupped or surrounded by the contact pad 150a that is embeddedly retained in an opening O7 of the buffer layer 110a. In some embodiments, a sidewall 332a of the conductive ball 330a abuts on or is in contact with a sidewall RS of the recess R1 defined by the contact pad 150a, and the buffer layer 110a is spaced apart from the sidewall 332a of the conductive ball 330a. Since the recess R1 provides a non-planar contact surface for the conductive ball 330a, the non-planar contact surface can prevent crack generation at the interface between the conductive ball 330a and the contact pad 150a.

Figure 29:
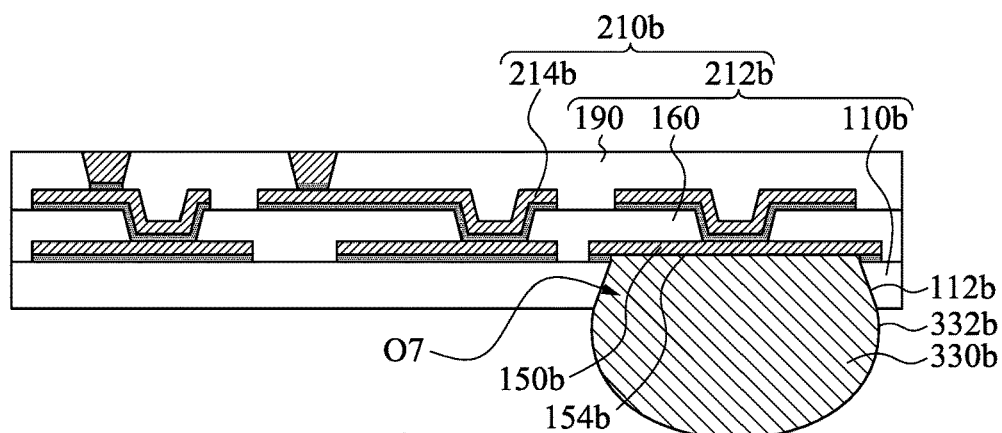
FIG. 29 is a fragmentary cross-sectional view of a package structure in accordance with some embodiments of the present disclosure.

FIG. 29 is a fragmentary cross-sectional view of a package structure in accordance with some embodiments of the present disclosure, in which a redistribution structure 210b, a contact pad 150b and a conductive ball 330b are shown. As shown in FIG. 29, the redistribution structure 210b includes a dielectric structure 212b and a wiring structure 214b present in the dielectric structure 212b. The dielectric structure 212b includes a buffer layer 110b that is proximal to conductive ball 330b. The buffer layer 110b has an opening O7 therein. At least a portion of the conductive ball 330b is embeddedly retained in the opening O7, and this portion of the conductive ball 330b is cupped or surrounded by the buffer layer 110b and may be not cupper or surrounded by the contact pad 150b. For example, the contact pad 150b may include a substantially planar contact surface 154b, and the conductive ball 330b is in contact with the substantially planar contact surface 154b and not cupped or surrounded by the contact pad 150b. In some embodiments, a sidewall 332b of the conductive ball 330b is adjacent to a sidewall 112b of the opening O7 of the buffer layer 110b, so as to prevent crack at the interface between the conductive ball 330b and the contact pad 150b. In some embodiments, the sidewall 332b of the conductive ball 330b may abut on or be in contact with the sidewall 112b of the opening O7, so as to further prevent the crack.

Figure 30:
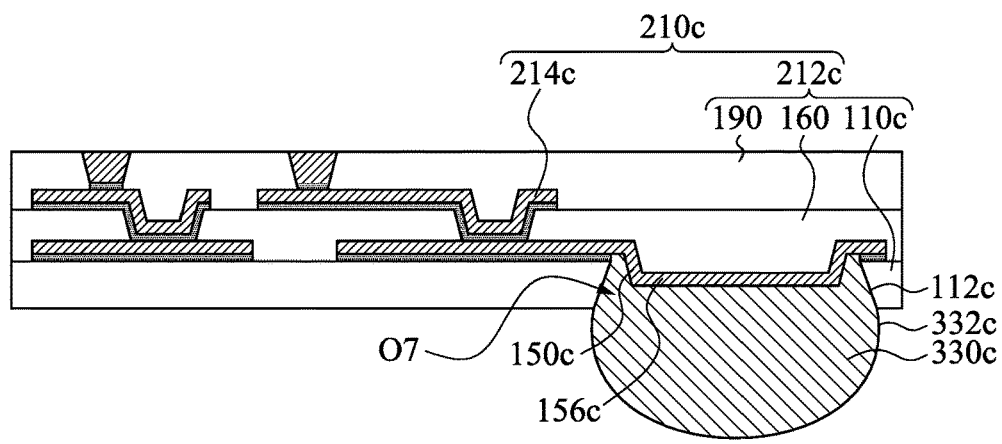
FIG. 30 is a fragmentary cross-sectional view of a package structure in accordance with some embodiments of the present disclosure.

FIG. 30 is a fragmentary cross-sectional view of a package structure in accordance with some embodiments of the present disclosure, in which a redistribution structure 210c, a contact pad 150c and a conductive ball 330c are shown. As shown in FIG. 30, the redistribution structure 210c includes a dielectric structure 212c and a wiring structure 214c present in the dielectric structure 212c. The dielectric structure 212c includes a buffer layer 110c that is proximal to conductive ball 330c. The buffer layer 110c has an opening O7 therein. At least a portion of the conductive ball 330c is embeddedly retained in the opening O7, and this portion of the conductive ball 330c is cupped or surrounded by the buffer layer 110c and may be not cupped or surrounded by the contact pad 150c. For example, the contact pad 150c may include a protruding portion 156c that protrudes toward the opening O7, and the conductive ball 330c is in contact with the protruding portion 156c and not cupped or surrounded by the contact pad 150c. In some embodiments, a sidewall 332c of the conductive ball 330c is adjacent to a sidewall 112c of the opening O7 of the buffer layer 110c, so as to prevent crack at the interface between the conductive ball 330c and the contact pad 150c. In some embodiments, the sidewall 332c of the conductive ball 330c may abut on or be in contact with the sidewall 112c of the opening O7, so as to further prevent crack.

In the aforementioned package structures formed by the "RDL-first" process according to some embodiments, at least a portion of the conductive ball is embeddedly retained in opening of dielectric layer, and crack at the interface between the conductive ball and the contact pad can be therefore prevented. Stated differently, the aforementioned package structures can provide non-planar UBM structures for the BGA during the "RDL-first" process, so that crack at the interface between the conductive balls of the BGA and the UBM structures can be prevented. In some embodiments, the "RDL-first" process that forms the aforementioned package structures is advantageous to distinguish that the electronic issues are caused by the pre-formed RDL or the post-placed first semiconductor devices. Further, the "RDL-first" process that forms the aforementioned package structures is also advantageous to rework, replace, remove, discard or flag the known bad dies.

According to some embodiments, a package structure includes a semiconductor device, a first dielectric layer, a redistribution line and a conductive bump. The first dielectric layer is over the semiconductor device and has first and second openings on opposite surfaces of the first dielectric layer, wherein the first and second openings taper in substantially opposite direction. The redistribution line is partially in the first opening of the first dielectric layer and electrically connected to the semiconductor device. The conductive bump is partially embeddedly retained in the second opening and electrically connected to the redistribution line.

According to some embodiments, a package structure includes a semiconductor device, a first dielectric layer, a redistribution line and a conductive bump. The first dielectric layer is over the semiconductor device and has first and second openings on opposite surfaces of the first dielectric layer. The redistribution line is partially in the first opening of the first dielectric layer and electrically connected to the semiconductor device. The redistribution line defines a first recess. The conductive bump includes an embedded portion in the second opening of the first dielectric layer, wherein the embedded portion and the first recess taper in substantially opposite directions.

According to some embodiments, a method of forming a package structure includes forming an under bump metallization (UBM) layer over a first dielectric layer, forming a redistribution structure over the UBM layer after the forming the UBM layer, disposing a semiconductor device on the redistribution structure, removing a portion of the first dielectric layer to form an opening to expose the UBM layer, and forming a conductive bump at least in the opening such that the conductive bump is electrically connected to the UBM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor device;
   a first dielectric layer proximate the semiconductor device and having first and second openings between opposite first and second surfaces of the first dielectric layer, wherein the first and second openings taper in substantially opposite directions;
   a conductive bump partially embeddedly retained in the second opening;
   a redistribution line positioned between the conductive bump and the semiconductor device, inside and outside the first opening of the first dielectric layer, and on the first surface of the first dielectric layer, the redistribution line being electrically connected to the semiconductor device and the conductive bump; and
   an under bump metallization structure electrically connected to the conductive bump, wherein the entire under bump metallization structure is inside the second opening of the first dielectric layer.

2. The package structure of claim 1, further comprising:
   a second dielectric layer proximate the first dielectric layer, the second dielectric layer having an opening therein, wherein the conductive bump is partially embeddedly retained in the opening of the second dielectric layer.

3. The package structure of claim 2, wherein the opening of the second dielectric layer and the first opening of the first dielectric layer taper in substantially opposite directions.

4. The package structure of claim 2, wherein a roughness of at least one sidewall of the opening of the second dielectric layer is greater than a roughness of a top surface of the second dielectric layer.

5. The package structure of claim 2, wherein the opening of the second dielectric layer comprises a jagged profile or a rough profile.

6. The package structure of claim 1, wherein the redistribution line is conformally over the first opening of the first dielectric layer and define a recess.

7. The package structure of claim 1, wherein the redistribution line defines a recess, and the recess and the second opening taper in substantially opposite directions.

8. The package structure of claim 1, further comprising:
   a third dielectric layer partially embedded in a recess defined by the redistribution line.

9. The package structure of claim 1, further comprising:
   a dielectric structure embedded in a recess defined by the redistribution line, wherein the dielectric structure and the second opening taper in substantially opposite directions.

10. The package structure of claim 1, further comprising:
    a molding material molding the semiconductor device; and
    a through-via penetrating through the molding material, wherein the semiconductor device comprises a semiconductor substrate, and the through-via has a surface substantially level with that of the semiconductor substrate.

11. The package structure of claim 1, wherein the under bump metallization structure is formed conformally over the second opening of the first dielectric layer.

12. The package structure of claim 1, wherein the under bump metallization structure comprises a cup-shaped portion and a ledge extending from an edge of the cup-shaped portion, wherein the ledge is thicker than the cup-shaped portion.

13. A package structure, comprising:
a semiconductor device;
a first dielectric layer over the semiconductor device and having first and second openings between opposite surfaces of the first dielectric layer;
a redistribution line defining a first recess;
a conductive bump comprising an embedded portion in the second opening of the first dielectric layer, wherein the embedded portion and the first recess taper in substantially opposite directions, wherein the redistribution line is positioned between the conductive bump and the semiconductor device, inside and outside the first opening of the first dielectric layer, and on a surface of the first dielectric layer and the redistribution line is electrically connected to the semiconductor device and the conductive bump; and
an under bump metallization structure including a cup-shaped portion and a ledge that extends from the cup-shaped portion and that is thicker than the cup-shaped portion.

14. The package structure of claim 13, further comprising:
a metal cup in the second opening of the first dielectric layer, wherein the embedded portion of the conductive bump is embedded in the metal cup.

15. The package structure of claim 14, further comprising:
a ledge protruding from an outer side of the metal cup, wherein the ledge is thicker than a wall of the metal cup.

16. The package structure of claim 13, wherein the under bump metallization structure defines a second recess, wherein the embedded portion is in the second recess, and the second recess and the first recess taper in substantially opposite directions.

17. A package structure, comprising:
a semiconductor device;
a first dielectric layer over the semiconductor device;
a redistribution line having a first taper portion embedded in the first dielectric layer through a first surface of the first dielectric layer;
a second dielectric layer over a second surface of the first dielectric layer and having an opening defined by an opening-defining wall; and
a conductive bump having a second taper portion embedded in the first dielectric layer through the opening of the second dielectric layer and the second surface of the first dielectric layer, wherein the first taper portion of the redistribution line and the second taper portion of the conductive bump taper in substantially opposite directions, wherein the redistribution line is positioned between the conductive bump and the semiconductor device and outside of the first dielectric layer on the first surface of the first dielectric layer, the redistribution line is electrically connected to the semiconductor device and the conductive bump, and the conductive bump is in contact with the entire opening-defining wall of the second dielectric layer.

18. The package structure of claim 17, wherein the second taper portion of the conductive bump has a bottom wider than a top of the first taper portion of the redistribution line.

19. The package structure of claim 17, further comprising:
an under bump metallization structure having a portion between the first taper portion of the redistribution line and the second taper portion of the conductive bump.

20. The package structure of claim 19, wherein the under bump metallization structure tapers in a direction substantially the same as the direction in which the second taper portion of the conductive bump tapers.

* * * * *